United States Patent
Masuda et al.

[11] Patent Number: 6,063,686
[45] Date of Patent: May 16, 2000

[54] METHOD OF MANUFACTURING AN IMPROVED SOI (SILICON-ON-INSULATOR) SEMICONDUCTOR INTEGRATED CIRCUIT DEVICE

[76] Inventors: Hiroo Masuda, 2196-129, Hirai, Hinode-machi, Nishitama-gun; Hisako Sato, 4-44-15-303, Minamiogikubo, Suginami-ku; Takahide Nakamura, 217, Hakonegasaki, Mizuho-machi, Nishitama-gun, all of Tokyo; Katsumi Tsuneno, 657-5, Nogami; Kimiko Aoyama, 1098-2-101, Shin-machi, both of Ohme-shi, Tokyo; Takahide Ikeda, 4-41-11, Nakaarai, Tokorosawa-shi, Saitama; Nobuyoshi Natsuaki, 1-11-23, Nangai, Higashiyamato-shi, Tokyo; Shinichiro Mitani, 5014-2, Kamiyamaguchi, Tokorozawa-shi, Saitama, all of Japan

[21] Appl. No.: 09/023,489

[22] Filed: Feb. 13, 1998

Related U.S. Application Data

[60] Continuation of application No. 08/552,980, Nov. 3, 1995, abandoned, which is a division of application No. 08/336,648, Nov. 4, 1994, abandoned.

[30] Foreign Application Priority Data

Nov. 5, 1993 [JP] Japan .................................. 5-277034

[51] Int. Cl.$^7$ .............................. H01L 21/76; H01L 21/30
[52] U.S. Cl. ........................ 438/406; 438/455; 438/928; 257/350
[58] Field of Search ............................. 257/74, 347, 508, 257/350; 438/157, 406, 928, 455

[56] References Cited

U.S. PATENT DOCUMENTS

| | | | |
|---|---|---|---|
| 4,870,475 | 9/1989 | Endo et al. .............................. | 257/508 |
| 4,980,308 | 12/1990 | Hayashi et al. ........................ | 438/157 |
| 5,130,772 | 7/1992 | Choi ........................................ | 257/347 |
| 5,140,391 | 8/1992 | Hayashi et al. ........................ | 257/347 |
| 5,294,821 | 3/1994 | Iwamatsu ................................ | 257/347 |

(List continued on next page.)

FOREIGN PATENT DOCUMENTS

| | | | |
|---|---|---|---|
| 61-78169 | 4/1986 | Japan ..................................... | 257/347 |
| 2-294076 | 12/1990 | Japan . | |

OTHER PUBLICATIONS

Nishihara et al., A Buried Capacitor DRAM Cell with Bonded SOI for 256M and 1Gbit DRAMS, IEDM 92, pp. 803–806, Dec. 1992.

(List continued on next page.)

Primary Examiner—Joni Chang
Assistant Examiner—William David Coleman
Attorney, Agent, or Firm—Antonelli, Terry, Stout & Kraus, LLP

[57] ABSTRACT

A method of fabricating a semiconductor device is provided wherein a first semiconductor substrate is prepared with a first insulating film formed over a first main surface of the first semiconductor substrate, s semiconductor film of n-type conductivity formed over the first insulating film, and a second insulating film formed over the semiconductor film so as to cover the first main surface. A second semiconductor substrate is also prepared with a third insulating film formed over the second semiconductor substrate. Next, the second insulating film and third insulating films are bonded together by thermal processing to join the first semiconductor substrate and the second semiconductor substrate. A portion of a second main surface of said first semiconductor substrate, opposite to said first main surface of the first semiconductor substrate is then removed to expose a portion of the first semiconductor substrate, thereby providing a semiconductor layer. A gate insulating film for an MISFET is formed over the semiconductor layer; a gate electrode for the MISFET is formed over the gate insulating film, and source and drain region for the MISFET are formed in the semiconductor layer. With this arrangement, the first insulating film serves as a gate insulating film for the MISFET, and the semiconductor film serves as a gate electrode for the MISFET.

40 Claims, 23 Drawing Sheets

U.S. PATENT DOCUMENTS

| | | | |
|---|---|---|---|
| 5,324,980 | 6/1994 | Kusunoki | 257/74 |
| 5,359,219 | 10/1994 | Hwang | 257/349 |
| 5,376,559 | 12/1994 | Mukai | 438/928 |
| 5,389,806 | 2/1995 | Hickernell et al. | 257/245 |
| 5,402,373 | 3/1995 | Aritome et al. | 257/316 |
| 5,482,877 | 1/1996 | Rhee | 438/157 |

OTHER PUBLICATIONS

Yamaguchi et al., "A High–Speed 0.6–μm 16K CMOS Gate Array on a Thin SIMOX Film", IEEE Trans. on Electron Devices, vol. 40, No. 1, Jan. 1993, pp. 179–185.

Tanaka et al., "Device/Circuit Simulation of Double–gate SOI–MOSFET", Tech. Rept. of IEICE, SDM92–142, 1993, pp. 1–13.

Tanaka et al., "Analysis of P+ Poly Si Double–gate Thin–Film SOI MOSFETs", IEEE 1991, pp. 26.6.1–26.6.4.

Nishihara et al., "A Buried Capacitor DRAM Cell with Bonded SOI for 356M and 1Gbit DRAMs", IEEE, 1992, pp. 32.2.1–32.2.4.

Koyama, "A Novel Cell Structure for Giga–bit EPROMs and Flash Memories Using Polysilicon Thin Film Transistors", IEEE, 1992, pp. 44–45.

(n = 0,1,2 -----)

FIG. 43
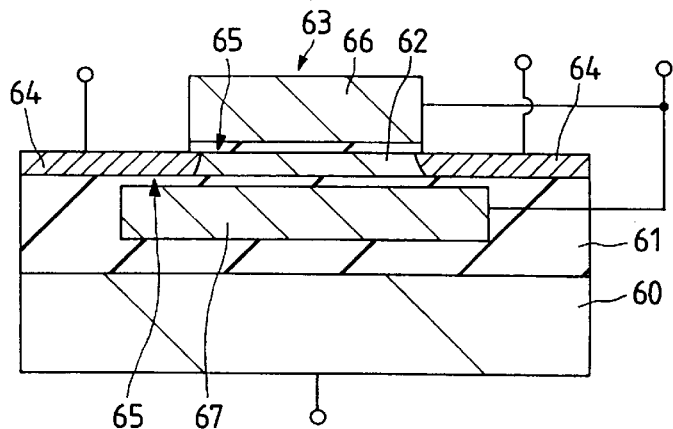
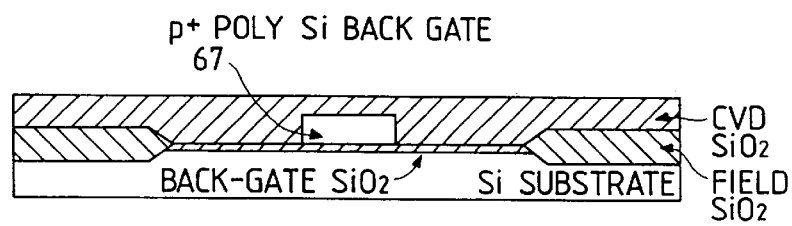
FIG. 44(a)
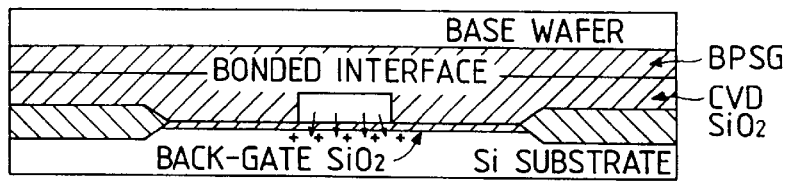
FIG. 44(b)
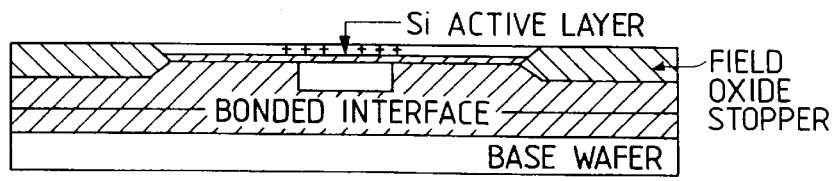
FIG. 44(c)
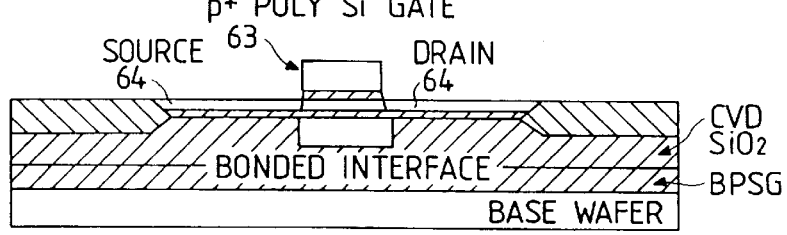
FIG. 44(d)

METHOD OF MANUFACTURING AN IMPROVED SOI (SILICON-ON-INSULATOR) SEMICONDUCTOR INTEGRATED CIRCUIT DEVICE

CROSS-REFERENCE TO RELATED APPLICATIONS

This application is a continuation of application Ser. No. 08/552,980, filed Nov. 3, 1995 abandoned; which is a divisional of application Ser. No. 08/336,648, filed Nov. 4, 1994 abandoned, the entire disclosure of which is hereby incorporated by reference.

BACKGROUND OF THE INVENTION

The present invention relates to a semiconductor integrated circuit device and a manufacturing method therefor, and, more specifically, to a semiconductor integrated circuit device having an SOI (silicon on insulator) structure and a manufacturing method of the device.

In the following description, an n-channel MOSFET (metal-oxide semiconductor field-effect transistor) is referred to as an nMOS, a p-channel MOSFET as a pMOS, and a complementary MOSFET, a combination of these MOSFET's, as a CMOS.

Similarly, an n-channel MIS (metal-insulator semiconductor) FET is referred to as a nMIS, a p-channel MISFET as a pMIS, and a complementary MISFET, a combination of these MISFET's, as a CMIS.

The SOI technique is one that forms a specified semiconductor integrated circuit device (hereinafter referred to as simply as a device) on a semiconductor thin film layer formed on an insulating layer, and has the following advantages, for example:

(1) Because complete device isolation is possible, the parasitic capacitance between interconnects and substrate and the diffusion layer capacitance can be reduced, improving the operation speed of the semiconductor integrated circuit device;

(2) Because the active parasitic devices such as parasitic MOS transistors and parasitic bipolar transistors can be prevented from being formed, it is possible to prevent latch-up; and (3) Resistance against α ray software error, a problem encountered in semiconductor memory devices, can be improved.

Some descriptions on the SOI technique may be found, for example, in Japanese Patent Laid-Open No. 294076/1990. A CMOS gate array using the SOI technique is described, for example, in a publication "A High-Speed 0.6 µm 16 k CMOS Gate Array on a Thin SIMOX Film" (IEEE Trans. on Electron Devices, published in January 1993, Vol. 40, No. 1, pp179–186).

This literature deals with a case where an nMOS is deposited on a semiconductor thin film layer formed on an insulating layer and discloses a technique to introduce a high concentration of p-type impurity into a channel region to set the threshold voltage to a specified value.

Setting the impurity concentration in a channel region high, however, reduces the mobility of carriers, which in turn lowers the transfer conductance of nMOS or the junction pressure resistance between drain region and channel region.

A technique to improve the situation mentioned above is introduced, for instance, in "Device/Circuit Simulation of Double-Gate SOI-MOSFET" (published Jan. 21, 1993, Denshi Joho Tsushin Gakkai Gijutsu Kenkyu Hokoku (Electronic Information Communication Society Meeting's Technical Report), Vol. 192, No. 424, SDM 92-137-149, pp27–32). This report describes a technology to control a threshold voltage of MOSFETs with the impurity concentration lowered in the channel region.

A method of fabricating a double-gate SOI-MOSFET is explained, for example, in "Analysis of p+ Polysilicon Double-Gate Thin-Film SOI MOSFETs" (Tech. Dig. 1991, pp683–686, IEDM (International Electron Device Meeting)). The technique introduced in this literature is shown in FIG. 43. On a semiconductor substrate 60 is formed an insulation layer 61, on which a semiconductor layer 62 is deposited. On the semiconductor layer 62 is formed an nMOS 63, which consists of a pair of semiconductor regions 64, 64 formed in the semiconductor layer 62, a gate insulation film 65 overlying the semiconductor layer 62, and a gate electrode 66 of p-type polysilicon formed over the gate insulation film 65.

This fabrication technique also forms in the insulation layer 61, another gate electrode 67 of p-type polysilicon having a size sufficient to substantially overlap the pair of semiconductor regions 64, 64 to permit the threshold voltage of the nMOS 63 to be set at a desired value with the impurity concentration lowered in the channel region of the nMOS 63. The gate electrode 67 is electrically connected to the gate electrode 66 of the nMOS 63. The method of fabrication introduced in this literature is explained by referring to FIGS. 44(a) through 44(d).

Double-gate SOI MOSFETs were fabricated as shown in FIG. 44(a). A thick field oxide is formed by conventional selective oxidation. The oxide acts as a stopper when polishing the silicon layer. A polysilicon back gate (p+ type) is then formed by conventional methods, followed by a $SiO_2$ layer being deposited by CVD (chemical vapor deposition) and then planarized by polishing.

As shown in FIG. 44(b), a BPSG (boron-doped phosphosilicate glass) film is deposited on the base wafer. Two wafers are bonded through CVD $SiO_2$ and BPSG by pulse-field-assisted bonding at 900° C. in a 0.1 $PaN_2$ atmosphere.

The silicon active layer is thinned by selective polishing. The thickness of the Si active layer is determined by a field oxide stopper.

The front gate (p+ type poly Si gate) is formed by conventional methods.

The method shown in FIGS. 44(a) to 44(d) requires a heat treatment at elevated temperatures at around 900° C. in a wafer bonding process in which two wafers are bonded together.

SUMMARY OF THE INVENTION

The inventor has found that the double-gate SOI MOSFET described in the above literature has a problem that because the same material is used for the upper and lower gates, the actual threshold voltage used is too high (or too low).

This invention has been accomplished in light of this problem and its objective is to provide a technique to improve controllability of threshold voltage in a device formed in a semiconductor integrated circuit device with a SOI structure.

These and other objects and features of this invention will become apparent from the following description in this specification and the accompanying drawings.

Representative aspects of this invention disclosed in this specification may be summarized as follows.

(1) In a semiconductor integrated circuit device having an SOI substrate, in which a MISFET's source-drain region is formed in a semiconductor layer deposited over the semiconductor substrate with an insulating layer interposed; in an area over the semiconductor substrate which faces at least a gate electrode of the MISFET through the semiconductor layer interposed therebetween, a lower electrode whose material has a different work function from that of the gate electrode material is formed, and either the gate electrode or the lower electrode is applied with a fixed bias voltage, or the gate electrode and the lower electrode are electrically connected. The structure of this semiconductor integrated circuit device is also characterized in that the gate insulation film between the gate electrode and the semiconductor layer differs in thickness from the lower insulation film between the lower electrode and the semiconductor layer.

(2) In a semiconductor integrated circuit device having an SOI substrate, in which a MISFET is formed in a semiconductor layer deposited over the semiconductor substrate with an insulation film interposed; a lower electrode is formed by introducing an impurity of a specified conductivity type and is enclosed by a well of a different conductivity type than that of the lower electrode, and the junction between the lower electrode and the well is applied a reverse bias voltage.

(3) In a method of fabricating the semiconductor integrated circuit device mentioned above by bonding two wafers, after the lower electrode is formed of an n-type silicon film, the wafers are bonded together, followed by the upper electrode being formed from a p-type silicon film.

According to the aspect (1), if the gate electrode is made from a material that allows easy forming of a channel and the lower gate electrode is made from a material with which it is difficult to form a channel, it is possible to control the state of the channel being formed and therefore to improve the controllability of the threshold voltage of the MISFET formed over the semiconductor layer.

Because the state of the channel being formed in the semiconductor layer can be controlled through the application of a certain fixed bias voltage to the lower electrode, the controllability of the threshold voltage of the MISFET formed on the semiconductor layer can be improved.

Further, because electrically connecting the gate electrode and the lower electrode almost doubles the transfer conductance from that obtained when they are not connected, it is possible to improve the drive capability of the MISFET.

Since the state of the channel being formed can be controlled by setting the gate insulation film and the lower insulation film to predetermined thicknesses, it is possible to improve the controllability of the threshold voltage of the MISFET formed over the semiconductor layer.

According to the aspect (2), it is possible to apply a specified fixed bias voltage to each lower electrode of the MISFETs formed over the semiconductor layer.

According to the aspect (3), the wafer bonding is done during the high-temperature heat treatment at around 900° C. after the n-type lower electrode has been formed, so that the amount of impurity that pierces through the gate insulation film into the channel forming region can be reduced from that when the lower electrode is formed of p-type silicon (boron-doped silicon, for example), making it possible to easily control the threshold voltage.

BRIEF DESCRIPTION OF THE DRAWINGS

FIG. 43 is a partial cross section of a conventional semiconductor integrated circuit device; and FIGS. 44(a) to 44(d) are fragmentary cross sections of the conventional semiconductor integrated circuit device in the manufacture process of FIG. 43.

DESCRIPTION OF THE PREFERRED EMBODIMENTS

Now, embodiments of this invention will be described in detail by referring to the accompanying drawings.

(Embodiment 1)

Figure 1A:
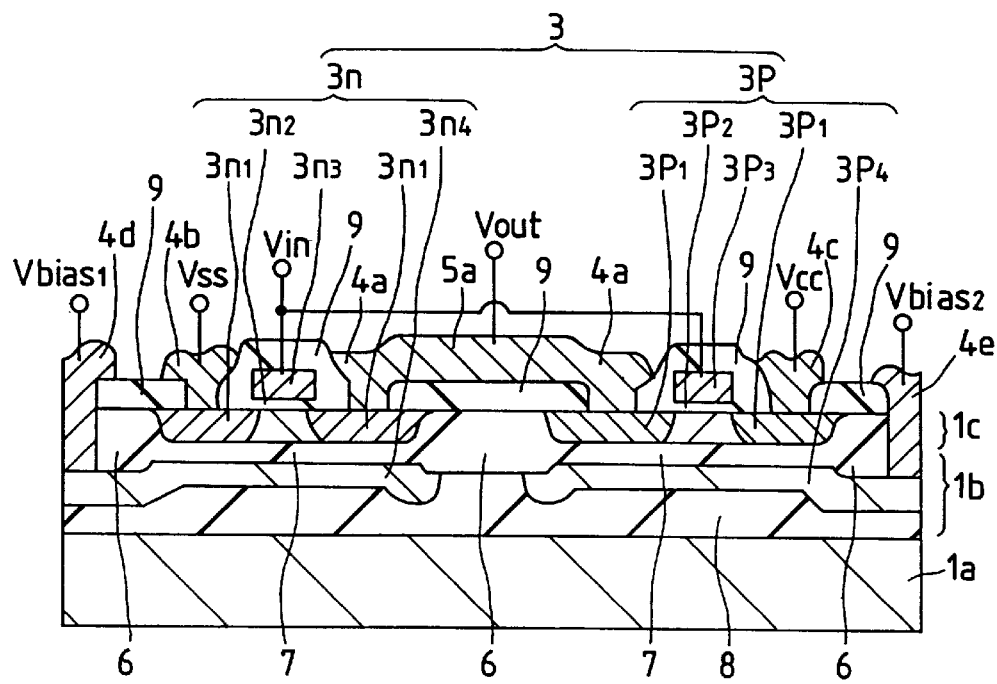
FIG. 1(a) is a cross section of an essential portion of a semiconductor integrated circuit device as one embodiment of this invention.
Figure 1B:
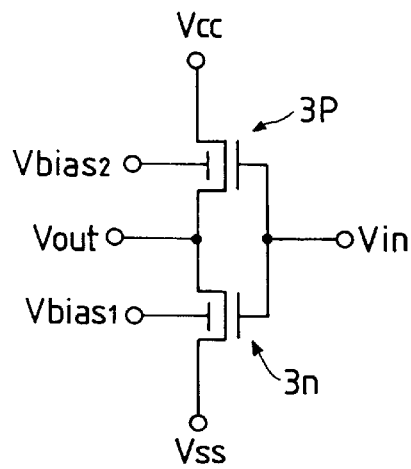
FIG. 1(b) is an equivalent circuit of a CMIS inverter circuit shown in FIG. 1(a)
Figure 2:
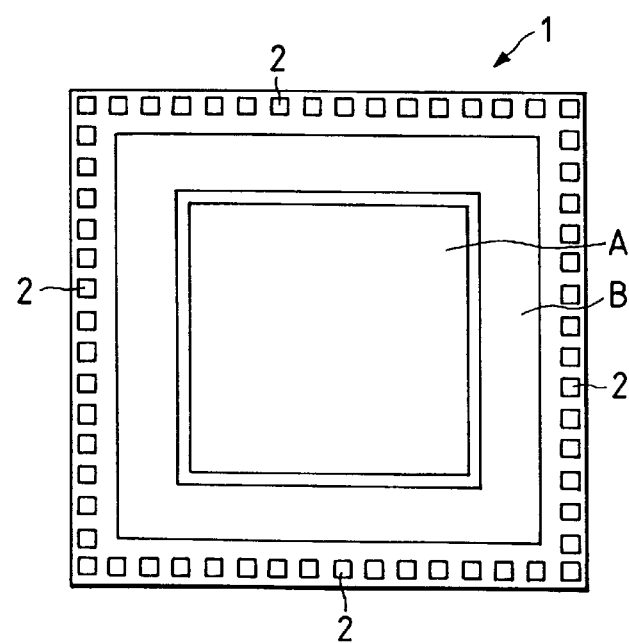
FIG. 2 is an overall plan view of a semiconductor chip forming the semiconductor integrated circuit device of FIG. 1(a)
Figure 3:
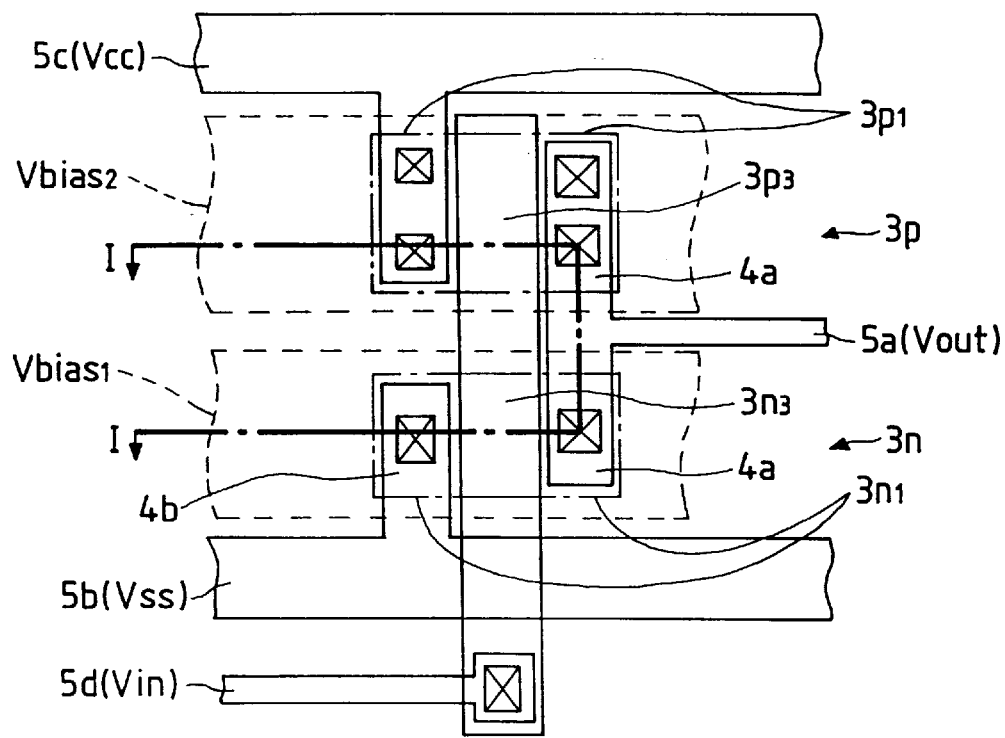
FIG. 3 is a fragmentary plan view of the semiconductor integrated circuit device of FIG. 1(a)
Figure 4:
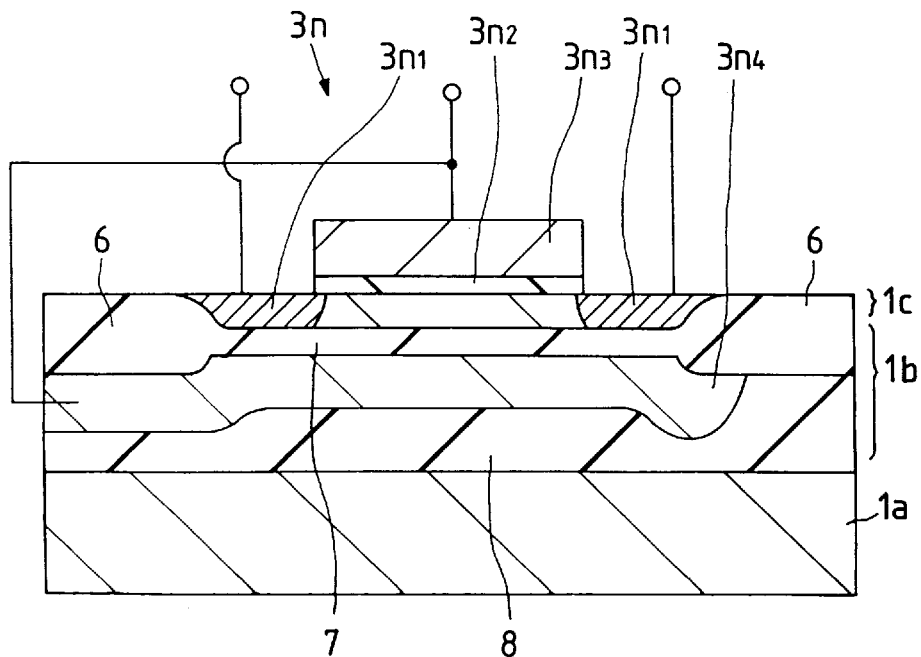
FIG. 4 is a fragmentary cross section of the semiconductor integrated circuit device of FIG. 1(a)
Figure 5:
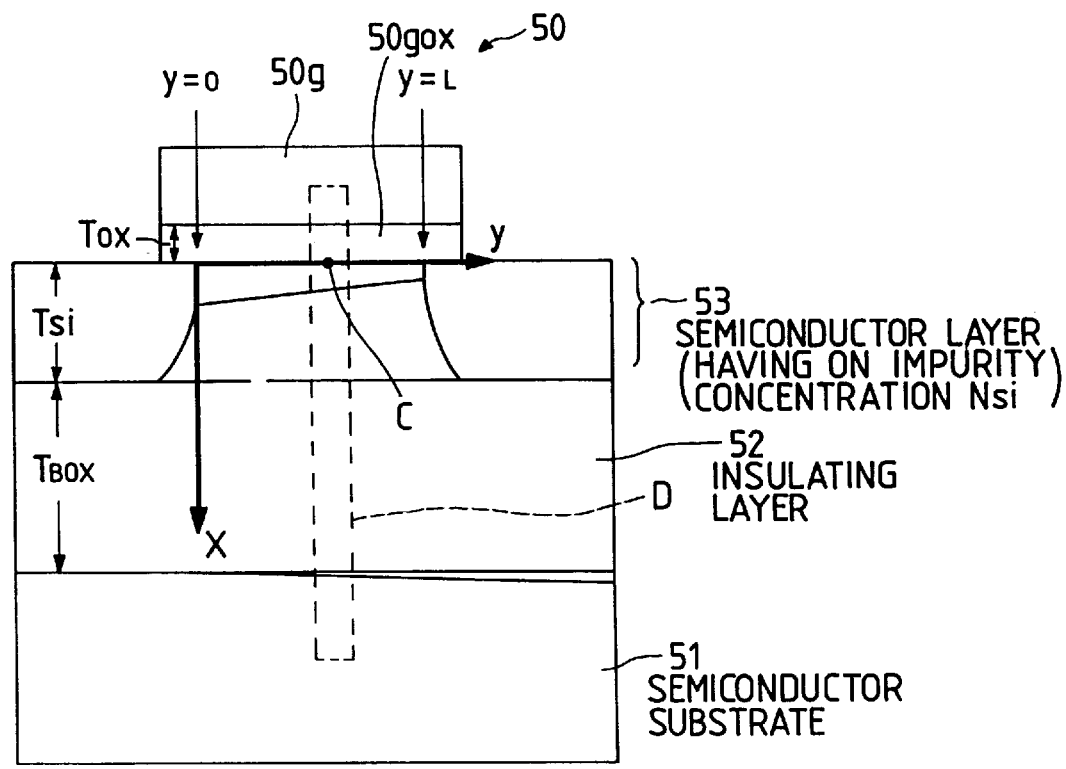
FIG. 5 is a schematic view showing the structure of an ordinary MOSFET.
Figure 6:
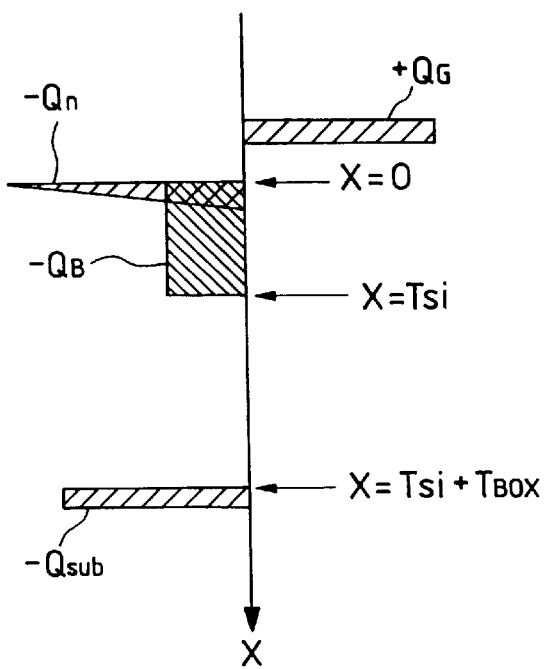
FIG. 6 is a graph showing a distribution of electric charge of FIG. 5.
Figure 7A:
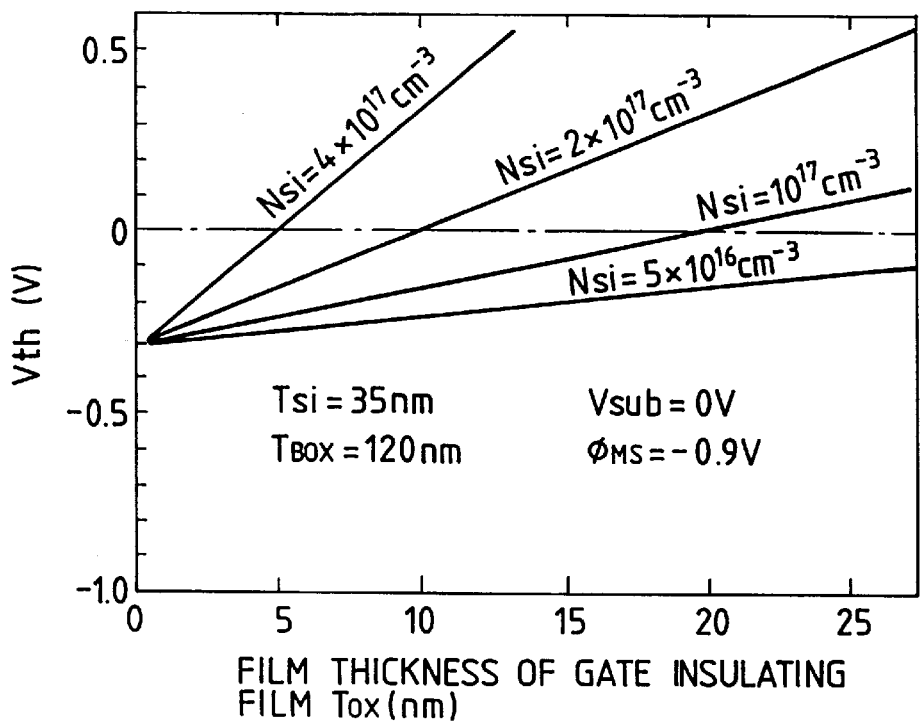
FIG. 7(a) is a graph showing the relation between a gate insulating film thickness and a threshold voltage in the ordinary nMOS.
Figure 7B:
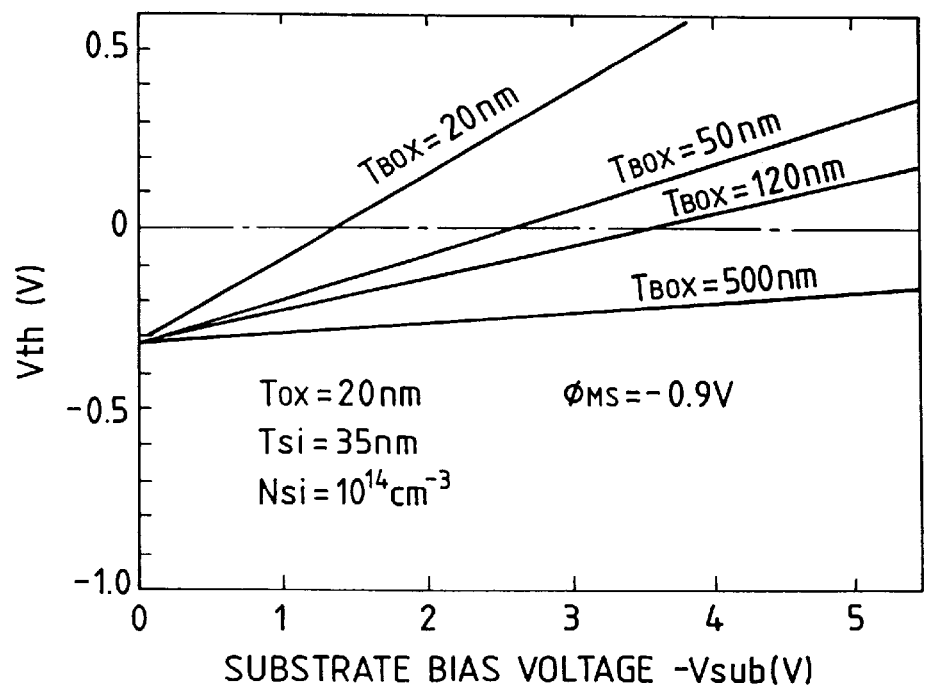
FIG. 7(b) is a graph showing the relation between a substrate bias voltage and a threshold voltage in the ordinary nMOS.

FIGS. 1(a) and 1(b) are fragmentary cross sections of one embodiment of the semiconductor integrated circuit device according to this invention. FIG. 2 is an overall plan view of the semiconductor chip of FIG. 2. FIG. 3 is a fragmentary plan view of the semiconductor integrated circuit device. FIG. 4 is a fragmentary cross section of the semiconductor integrated circuit device. FIG. 5 is a cross section schematically showing the structure of an ordinary MISFET. FIG. 6 is a graph showing an electric charge distribution of FIG. 5. FIG. 7(a) is a graph showing the relation between a gate insulating film thickness and a threshold voltage in the ordinary nMIS. FIG. 7(b) is a graph showing the relation between a substrate bias voltage and a threshold voltage in the ordinary nMIS. FIGS. 8(a) to 8(d) are graphs showing threshold voltages when the materials of the gate electrode and the lower electrode of the nMIS are changed. FIG. 9(a) is a graph showing the relation between a gate insulating film thickness and a threshold voltage in an ordinary pMIS. FIG. 9(b) is a graph showing the relation between a substrate bias voltage and a threshold voltage in an ordinary pMIS. FIGS. 10(a) to 10(d) are graphs showing threshold voltages when the materials of the gate electrode and the lower electrode of the pMIS are changed. FIGS. 11 through 19 are fragmentary cross sections of the semiconductor integrated circuit device of the first embodiment in the manufacture processes.

The semiconductor integrated circuit device of the first embodiment is, for example, a CMIS gate array which may be formed into a square semiconductor chip as shown in FIG. 2.

At the center of the main surface of the semiconductor chip 1 is arranged an internal circuit region A, in which semiconductor integrated circuit elements constituting logic circuits such as CMIS's are formed.

On the outside of the internal circuit region A is arranged an external circuit region B, in which are formed semiconductor integrated circuit elements that constitute input and output circuits such as a buffer circuit.

On the outer side of the external circuit region B are arranged a plurality of bonding pads 2, which may be formed, for example, from an aluminum (Al)-silicon (Si)-copper (Cu) alloy and are arranged along the outer circumference of the semiconductor chip 1 at specified intervals.

An enlarged plan view of an essential portion of the internal circuit region A is shown in FIG. 3. The cross section taken along the line I—I of FIG. 3 is Shown in FIG. 1(a).

The semiconductor chip 1 of the first embodiment consists of a semiconductor substrate 1a, an insulating layer 1b formed on the semiconductor substrate 1a, and a semiconductor layer 1c formed on the insulating layer 1b.

The semiconductor substrate 1a is formed, for example, from a p-type silicon monocrystal. The semiconductor substrate 1a is doped with a p-type impurity such as boron, whose concentration is around $1 \times 10^{15}$ atms/cm$^3$.

The insulating layer 1b is made, for example, from a silicon oxide (SiO$_2$). The semiconductor layer 1c is made, for example, from a p-type monocrystal silicon.

The semiconductor layer 1c may be formed with a CMIS 3, which consists of an nMIS 3n and a pMIS 3p.

The nMIS 3n includes a pair of diffusion layers $3n_1$, $3n_1$ formed in the semiconductor layer 1c, a gate insulating film $3n_2$ formed on the semiconductor layer 1c, and a gate electrode $3n_3$ formed over the gate insulating film $3n_2$.

The gate insulating film $3n_2$ is formed, for example, of $SiO_2$ and about 10 nm thick. The diffusion layer $3n_1$ is doped with an n-type impurity such as arsenic (As) at a concentration level of about $1\times10^{20}$ atoms/cm$^3$. The gate electrode $3n_3$ is formed, for instance, of an n-type polysilicon which is doped with an n-type impurity such as phosphorus at the concentration level of around $1\times10^{20}$ atoms/cm$^3$.

The pMIS 3p includes a pair of diffusion layers $3p_1$, $3p_1$ formed in the semiconductor layer 1c, a gate insulating film $3p_2$ deposited over the semiconductor layer 1c, and a gate electrode $3p_3$ formed over the gate insulating film $3p_2$.

The gate insulating film $3p_2$ is made, for example, from $SiO_2$ and about 10 nm thick. The diffusion layer $3p_1$ is doped with a p-type impurity such as boron at a concentration level of about $1\times10^{20}$ atoms/cm$^3$. The gate electrode $3p_3$ is formed, for instance, of an n-type polysilicon which is doped with an n-type impurity such as phosphorus at the concentration level of around $1\times10^{20}$ atoms/cm$^3$.

One of the paired diffusion layers $3n_1$, $3n_1$ of the nMIS 3n and one of the paired diffusion layers $3p_1$, $3p_1$ of the pMIS 3p are electrically connected through leadout electrodes 4a and an interconnect 5a formed integral with the electrodes. The interconnect 5a is electrically connected with an output $V_{out}$.

The other of the paired diffusion layers $3n_1$, $3n_1$ of the nMIS 3n is electrically connected to a leadout electrode 4b and an interconnect 5b for ground voltage ($V_{ss}$) formed integral with the leadout electrode 4b. Also, the other of the paired diffusion layers $3p_1$, $3p_1$ of the pMIS 3p is electrically connected to a leadout electrode 4c and an interconnect 5c for power supply voltage ($V_{cc}$) formed integral with the leadout electrode 4c.

The gate electrode $3n_3$ of the nMIS 3n and the gate electrode $3p_3$ of the pMIS 3p are integrally formed and electrically connected to an interconnect 5d, which in turn is electrically connected to an input ($V_{in}$).

In the insulating layer 1b beneath the nMIS 3n and pMIS 3p, the first embodiment has lower electrodes $3n_4$, $3p_4$.

The lower electrodes $3n_4$, $3p_4$ are formed, for instance, of a p-type polysilicon, a material whose work function is different from that of the material of the gate electrodes $3n_3$, $3p_3$ of nMIS 3n and pMIS 3p. The lower electrodes $3n_4$, $3p_4$ are doped with a p-type impurity such as boron at a concentration of about $1\times10^{20}$ atoms/cm$^3$.

In the first embodiment, the lower electrodes $3n_4$, $3p_4$ of the nMIS 3n and pMIS 3p in the internal circuit region A are electrically connected to fixed bias supply voltage interconnects $V_{bias1}$, $V_{bias2}$, respectively, which are in turn electrically connected to a fixed bias power supply. In this first embodiment, the fixed bias supply voltage is set to zero (0) V. In this way, the nMIS 3n and pMIS 3p together form the CMIS 3. The equivalent circuit of the CMIS 3 is shown in FIG. 1(b).

The first embodiment allows a common fixed bias supply voltage to be supplied to the plurality of nMIS's 3n in the internal circuit region A and another common fixed bias supply voltage to be supplied to the plurality of pMIS's 3p in the internal circuit region A.

Thus, there is no need to provide a fixed bias supply voltage terminal to each nMIS 3n or pMIS 3p. Rather it is only necessary to provide the terminal for the fixed bias supply voltage to each circuit block in the internal circuit region A, so that the integration level of the semiconductor IC circuits is prevented from being degraded by the feeding of the fixed bias supply voltage.

In this way, the first embodiment permits a specified fixed bias supply voltage to be applied to the lower electrodes $3n_4$, $3p_4$ provided beneath the nMIS 3n and pMIS 3p. By forming the gate electrodes $3n_3$, $3p_3$ and the lower electrodes $3n_4$, $3p_4$ with different materials, this embodiment also allows the threshold voltages of the nMIS 3n and pMIS 3p to be set to desired values. Details will be described later.

The leadout electrodes 4a–4e and the interconnects 5a–5d are made from Al—Si—Cu alloy, for instance. In a specified region of the semiconductor layer 1c a field insulating film 6 is formed of, say, $SiO_2$ to isolate circuit elements from each other. The insulating layer 1b consists of the field insulating film 6, an insulating film (lower insulating film) 7, and an insulating film 8. Denoted 9 is an insulating film formed of such material as $SiO_2$.

The cross section of an essential portion of the external circuit region B in the semiconductor chip 1 is shown in FIG. 4. This is an enlarged cross section of the nMIS 3n that forms the output circuit. In this embodiment, the gate electrode $3n_3$ and the lower electrode $3n_4$ of the nMIS 3n in the external circuit region B are electrically connected, as shown in FIG. 4. This almost doubles the transfer conductance of the nMIS 3n in the internal circuit region A.

Further, the thickness of the insulating film 7 between the semiconductor layer 1c and the lower electrodes $3n_4$, $3p_4$ differs from that of the gate insulating films $3n2$, $3p_2$. By setting the thickness ratio between the insulating film 7 and the gate insulating films $3n2$, $3p_2$ to a specified value, it is possible to set to a desired value the threshold voltage of, particularly, the nMIS 3n in which the gate electrode $3n_3$ and the lower electrode $3n_4$ are interconnected.

The thickness of the insulating film 7 in the nMIS 3n forming region is about 20 nm. That is, by making thin the insulating film 7 underlying the active layer formed in the nMIS 3n and pMIS 3p, it is possible to make the threshold voltage-fixed bias supply voltage characteristic effective. At the Same time, by making thick other insulating films (field insulating film 6) than the insulating film 7, the parasitic capacitance can be reduced.

Next, the workings of the semiconductor integrated circuit device of the first embodiment will be described.

Here, an nMOS is taken for example and how the drain current and the threshold voltage are determined are explained by referring to FIGS. 5 and 6.

FIG. 5 schematically shows the structure of an ordinary nMOS 50 formed over the SOI substrate. Denoted 50g is a gate electrode of the nMOS 50, and 50gox a gate insulating film of the nMOS. Reference numeral 51 represents a semiconductor substrate, 52 an insulating layer and 53 a semiconductor layer. The source-drain-channel region of the nMOS 50 is formed in the semiconductor layer 53, which corresponds to the semiconductor layer in FIG. 1(a) and FIG. 4. FIG. 6 represents an electric charge distribution of FIG. 5 and has the same X-Y coordinate axes as shown in FIG. 5.

The following equation 1 representing Gauss' theorem is applied along a broken line D including a point C (channel surface) of FIG. 5.

$$\Phi D1d1 = Q \qquad \text{[Equation 1]}$$

As a result, a gate electric charge $Q_G$ (electric charge on the gate electrode), a channel electric charge $Q_n$ (electric charge in the channel region), an impurity electric charge $Q_B$ in the semiconductor layer 53, and a substrate surface electric charge $Q_{sub}$ (electric charge induced over the substrate 51 surface) are induced, as shown in FIG. 6, and are seen to satisfy the relationship of the following equation 2 (when the interface fixed electric charge $Q_{ss}$=0).

$$Q_G = Q_n + Q_B Q_{sub} \quad \text{[Equation 2]}$$

If the potential at point C is represented by $\Phi(y)$, these charges are determined by the following equations—Equation 3 to Equation 5.

$$Q_G = -C_{ox}(V_G - 2\phi_F - \Psi(y)) \quad \text{[Equation 3]}$$

$$Q_B = -qN_{Si}T_{Si} \quad \text{[Equation 4]}$$

$$Q_{sub} = -C^*_{BOX}(\Psi(y) + 2\Phi_F - \Psi_{sub}) \quad \text{[Equation 5]}$$

where $C_{OX}$ is a unit gate capacitance ($=\epsilon_{OX}$ (dielectric constant)/$T_{OX}$ (gate insulating film thickness)); $\phi_F$ is a Fermi's potential, q is a unit electric charge ($=1.6 \times 10^{-19}$C); $N_{Si}$ is an impurity concentration in the semiconductor layer 53 (acceptor type); $\phi_{sub}$ is a substrate potential of the semiconductor substrate 51; and $T_{Si}$ is a thickness of the semiconductor layer 53. $C_{BOX}$ is an equivalent insulating film thickness between the semiconductor layer 53 and the insulating layer 52 and is defined by Equation 6 shown below.

$$C^*_{BOX} = \frac{\varepsilon_{OX}}{(\varepsilon_{Si}/\varepsilon_{OX})T_{Si} + T_{BOX}} \quad \text{[Equation 6]}$$

where $\epsilon_{Si}$ is a dielectric constant of Si.

Next, substituting the above equations—Equation 3 through Equation 5—into Equation 2 solves the channel electric charge $Q_n$ as the function of $\phi(y)$ as defined by Equation 7 shown below.

$$Q_n = -C_{OX}\left[\left(V_G - 2\phi_F - \frac{qN_{Si}T_{Si}}{C_{OX}} + \frac{C^*_{BOX}}{C_{OX}}\left(\Psi_{sub} - 2\phi_F - \left(1 + \frac{C^*_{BOX}}{C_{OX}}\right)\Psi(y)\right)\right)\right] \quad \text{[Equation 7]}$$

On the other hand, in the case of nMOS the drift component dominates and the drain current $I_{ds}$ can be expressed by Equation 8.

$$I_{ds} = -WQ_n\mu_n\frac{d\Psi(y)}{dy} \quad \text{[Equation 8]}$$

where $\mu_n$ represents the mobility of carriers (electrons), and W represents the channel width. Next, substituting Equation 7 into Equation 8 and integrating the both side members from the source end to the drain end results in an analytical equation representing the drain current $I_{ds}$ of Equation 9. Here, it is assumed that $\mu_n$ is constant.

$$I_{ds} = \frac{W}{L}C_{OX}\mu_n\left[(V_G - V^*_{TH})V_D - \left(1 + \frac{C^*_{BOX}}{C_{OX}}\right)\frac{V_D^2}{2}\right] \quad \text{[Equation 9]}$$

where $V_{TH}$ is a threshold voltage when a substrate potential $\phi_{sub}$ is impressed and is given by the following Equation 10.

$$V^*_{TH} = \phi_{MS} + 2\phi_F + \frac{qN_{Si}T_{Si}}{C_{OX}} + \frac{C^*_{BOX}}{C_{OX}}(|\Psi_{sub}| + 2\phi_F)$$

where $\phi_{MS}$ is a difference in work function between the semiconductor layer 53 and the gate electrode 50g. If we let the function work difference between the semiconductor substrate 51 and the semiconductor layer 53 be $\phi_{bs}$, then the substrate potential $\phi_{sub}$ with respect to the substrate bias voltage $V_{sub}$ is given by Equation 11.

$$\Psi_{sub} = V_b - \phi_{bs} \quad \text{[Equation 11]}$$

Here, if an n-type polysilicon is used for the material of the gate electrode 50g and a p-type silicon is used for the material of the semiconductor substrate 51, then $\phi_{MS}$=−0.9V. Because $\phi_F$=about 0.3 V, $2\phi_F$=about 0.6 V. Thus, it is understood that a desired value of $V_{TH}$>0 should be set using the third and fourth term in the right-hand member of Equation 10.

Calculating the $V_{TH}$ of nMOS 50 based on the Equation 10 and plotting on a graph, we obtain curves as shown in FIGS. 7(a) and 7(b).

FIG. 7(a) represents the relationship between the thickness $T_{OX}$ of the gate insulating film 50gox and the threshold voltage $V_{TH}$ when the semiconductor layer 53 is 35 nm thick, the insulating layer 52 is 120 nm thick, $\phi_{sub}$ is 0 V and the p-type impurity concentration $N_{Si}$ in the semiconductor layer 53 is taken as a parameter. As can be seen from this diagram, it is very difficult to set $V_{TH}$>0 to a desired value to meet the fundamental requirement of the microfine nMOS 50 for smaller thickness $T_{OX}$ of the gate insulating film 50gox.

FIG. 7(b) shows variations of $V_{TH}$ as the substrate bias voltage $V_{sub}$ is changed, with the structural dimensions set to the values shown in the figure. The diagram indicates that the value of $V_{TH}$ increases in proportion to the absolute value of the $V_{sub}$ and the amount of change of $V_{TH}$ increases as the thickness of the insulating layer 52 is reduced.

When the semiconductor substrate 51 is considered as the lower gate electrode of the nMOS 50, the substrate bias voltage $V_{sub}$ becomes equal to the gate voltage $V_g$. An equation defining the $V_{TH}$ at this time is expressed as Equation 12, which is obtained from Equation 7, 10 and 11.

$$V^*_{TH} = \frac{1}{1+r_c}[\phi_{MS} + r_c\phi_{bs}] + 2\phi_F + \frac{qN_{Si}T_{Si}}{C_{OX}} \quad \text{[Equation 12]}$$

Here $r_c$ can be given by Equation 13.

$$r_c = \frac{C^*_{BOX}}{C_{OX}}\left(= \frac{T_{OX}}{T_{BOX}}\right) \quad \text{[Equation 13]}$$

It is therefore understood that the $V_{TH}$ can be set relatively easily with good controllability by selecting appropriate values for the work function difference $\phi_{MS}$ between the semiconductor layer 53 and the gate electrode 50g, the work function difference $\phi_{bs}$ between the lower gate electrode (semiconductor substrate) 51 and the semiconductor layer 53, and $r_c$.

FIGS. 8(a) to 8(d) show how $V_{TH}$ changes according to $\phi_{MS}$, $\phi_{bs}$ and $r_c$. Here, it is assumed that the gate electrode of the nMOS 50 is made from a commonly used n-type polysilicon or p-type polysilicon and that the channel region of the semiconductor layer 1c is made from a silicon which is doped with a low concentration of p-type impurity. Here, the gate electrode 50g and the semiconductor substrate 51 correspond to the upper gate electrode and lower gate electrode, respectively, of the nMOS 50 and also to the gate electrode $3n_3$ and lower electrode $3n_4$, respectively, of the nMIS 3n.

Figure 8A:
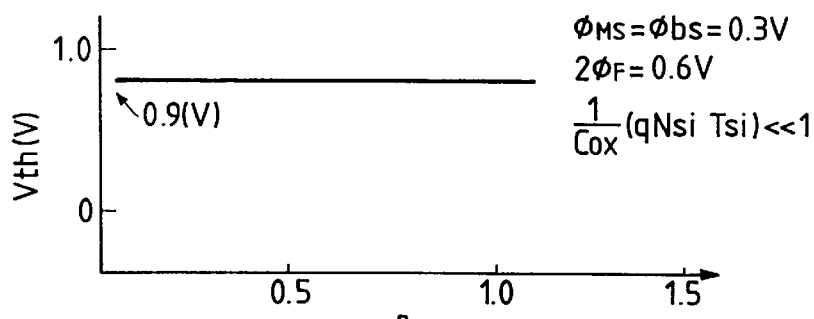
FIGS. 8(a) to 8(d) are graphs showing threshold voltages when the materials of the gate electrode and the lower electrode of the nMOS are changed.
Figure 9A:
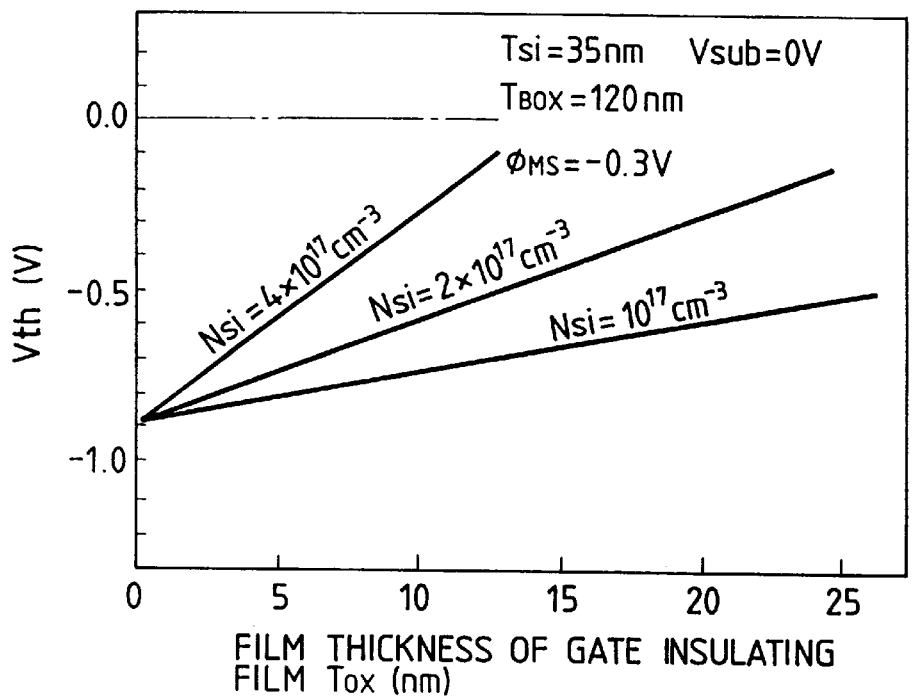
FIG. 9(a) is a graph showing the relation between a gate insulating film thickness and a threshold voltage in an ordinary pMOS.
Figure 9B:
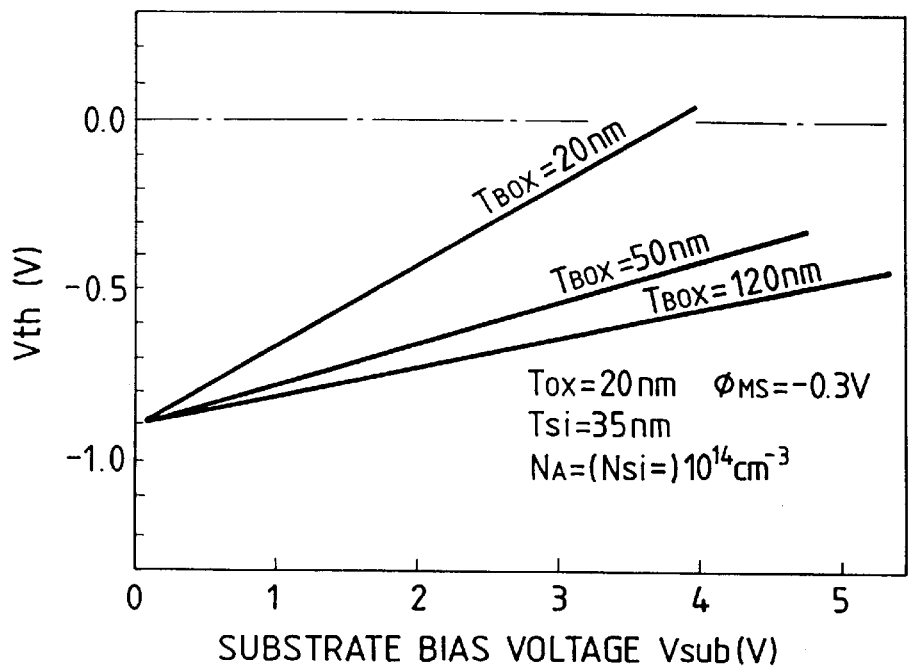
FIG. 9(b) is a graph showing the relation between a substrate bias voltage and a threshold voltage in an ordinary pMOS.

FIG. 8(a) represents a case where the gate electrode 50g (gate electrode $3n_3$ of nMIS 3n) and the lower gate electrode 51 (lower electrode $3n_4$ of nMIS 3n) are both made from a p-type polysilicon. Here, $\phi_{MS}$ and $\phi_{bs}$ are set to 0.3 V and $2\phi_F$ to 0.6 V. In this case, the $V_{TH}$ does not depend on $r_c$ and takes a value of, for instance, 0.9 V, a value higher than the desired one. The desired value of $V_{TH}$, when the supply voltage is in the range of between 3 V and 5 V, falls in a 0.3–0.5 V range. When the supply voltage is 1.5 V, for instance, the desired value of $V_{TH}$ is about 0.1–0.15 V.

Figure 8B:
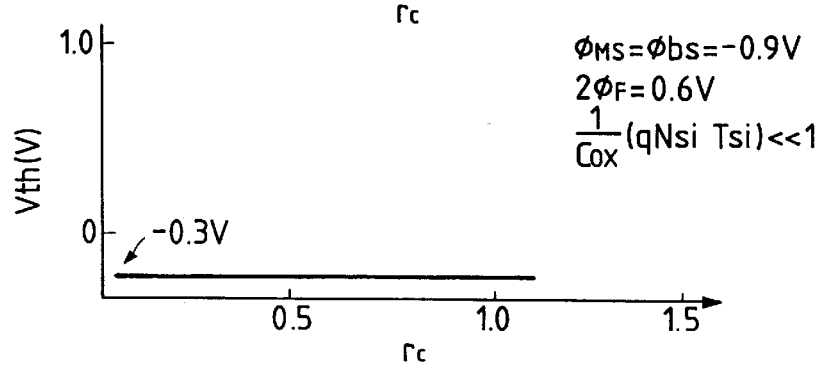

FIG. 8(b) represents a case where the gate electrode 50g (gate electrode $3n_3$ of nMIS 3n) and the lower gate electrode 51 (lower electrode $3n_4$ of nMIS 3n) are both made from an n-type polysilicon. Here, $\phi_{MS}$ and $\phi_{bs}$ are set to −0.9 V and $2\phi_F$ to 0.6 V. In this case, the $V_{TH}$ does not depend on $r_c$ and takes a value of, for instance, −0.3 V, a value lower than the desired one.

Figure 8C:
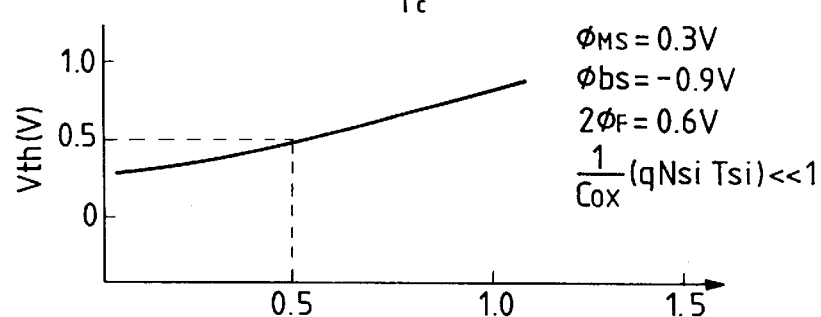

FIG. 8(c) represents a case where the gate electrode 50g (gate electrode $3n_3$ of nMIS 3n) is made from a p-type polysilicon and the lower gate electrode 51 (lower electrode $3n_4$ of nMIS 3n) is made from an n-type polysilicon. Here, $\phi_{MS}$ is set to 0.3 V, $\phi_{bs}$ to −0.9 V and $2\phi_F$ to 0.6 V. In this case, the $V_{TH}$ can be controlled by $r_c$. To realize $V_{TH}$=0.5 V, for example, $r_c$ needs to be set to about 0.5, as can be seen from FIG. 8(c).

Figure 8D:
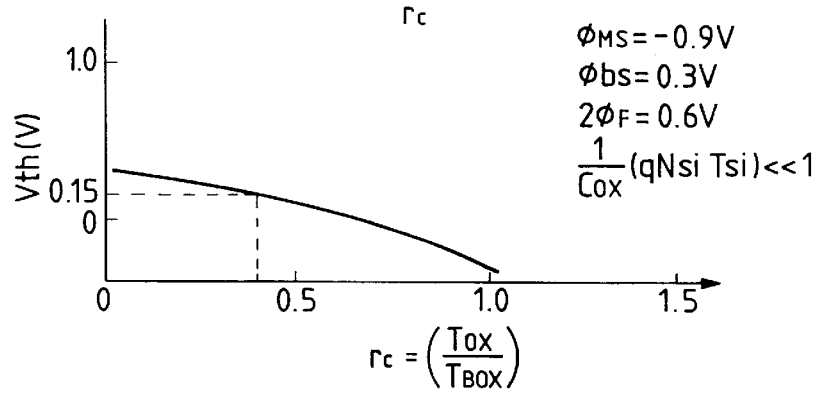

FIG. 8(d) represents a case where the gate electrode 50g (gate electrode $3n_3$ of nMIS 3n) is made from an n-type polysilicon and the lower gate electrode 51 (lower electrode $3n_4$ of nMIS 3n) is made from a p-type polysilicon (i.e., the first embodiment). Here, $\phi_{MS}$ is set to −0.9 V, $\phi_{bs}$ to 0.3 V and $2\phi_F$ to 0.6 V. In this case, too, the $V_{TH}$ can be controlled by $r_c$. To realize $V_{TH}$=0.15 V, for example, $r_c$ needs to be set to about 0.4.

In this way, the semiconductor integrated circuit device of the first embodiment has the gate electrode $3n_3$ and the lower electrode $3n_4$ formed of materials with different work functions, that is, a material that permits easy forming of channel and a material that does not, so that when the device is operated at low power supply voltages, the threshold voltage $V_{TH}$ can be controlled with good controllability.

This is obvious if we consider the fact that the threshold voltage $V_{TH}$ can be set arbitrarily in the range of about 0–0.3 V by controlling the boron concentration in the semiconductor layer 1c. By controlling the $r_c$ and the boron concentration in the semiconductor layer 1c, it is possible to set the threshold voltage $V_{TH}$ in the range of about 0 V to 0.45 V.

Because variations of the threshold voltage $V_{TH}$ caused by variations of $r_c$ can be suppressed to a relatively small value, the controllability of the threshold voltage $V_{TH}$ is good. In the structure of FIG. 8(d), it is obvious that the threshold voltage $V_{TH}$ is larger than 0 V even when the boron concentration in the semiconductor layer 1c is changed.

Further, in the construction of FIG. 8(d), by controlling the threshold voltage $V_{TH}$ by increasing the boron concentration in the semiconductor layer 1c, it is possible to shorten the depletion layer extending from the drain region and thereby to increase the punch-through resistance between source and drain, when compared with the structure of FIG. 8(c) where an almost intrinsic silicon is used for the semiconductor layer 1c.

Next, the values of $V_{TH}$ of pMOS calculated in the same way as the above-mentioned nMOS 50 are shown. The graphs of $V_{TH}$ of pMOS that correspond to FIGS. 7(a) and 7(b) are shown in FIGS. 9(a) and 9(b). Here, it is assumed that the gate electrode of pMOS is made from a commonly used n-type polysilicon and that the channel region in the semiconductor layer is formed of a silicon which is doped with a low concentration of p-type impurity.

In this case, how the $V_{TH}$ of pMOS changes according to $\phi_{MS}$, $\phi_{bs}$ and $r_c$ is shown in FIGS. 10(a) to 10(d), which correspond to FIGS. 8(a) to 8(d) of nMOS 50.

Figure 10A:
FIGS. 10(a) to 10(d) are graphs showing threshold voltages when the materials of the gate electrode and the lower electrode of the pMOS are changed.

FIG. 10(a) represents a case where the gate electrode $3p_3$ and the lower electrode $3p_4$ are both formed of a p-type polysilicon. Here, $\phi_{MS}$ and $\phi_{bs}$ are set to −0.3 V and $2\phi_F$ to −0.6 V. In this case, the $V_{TH}$ does not depend on $r_c$ and takes a value of, for instance, −0.9 V.

Figure 10B:
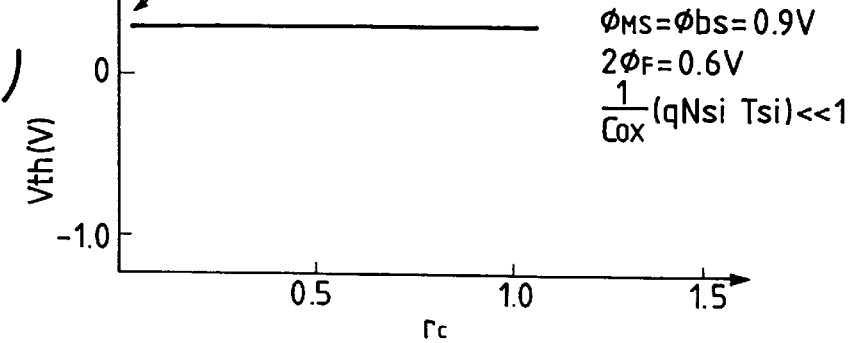

FIG. 10(b) represents a case where the gate electrode $3p_3$ and the lower electrode $3p_4$ are both formed of an n-type polysilicon. Here, $\phi_{MS}$ and $\phi_{bs}$ are set to 0.9 V and $2\phi_F$ to 0.6 V. In this case, the $V_{TH}$ does not depend on $r_c$ and takes a value of, for instance, 0.3 V.

Figure 10C:
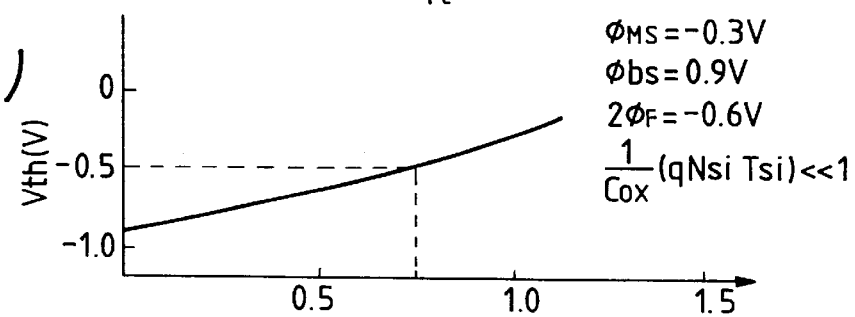

FIG. 10(c) represents a case where the gate electrode $3p_3$ is made from a p-type polysilicon and the lower electrode $3p_4$ is made from a n n-type polysilicon. Here, $\phi_{MS}$ is set to −0.3 V, $\phi_{bs}$ to 0.9 V and $2\phi_F$ to −0.6 V. In this case, the $V_{TH}$ can be controlled by the value of $r_c$. To realize $V_{TH}$=−0.5 V, for example, the $r_c$ needs to be set to about 0.75, as can be seen from FIG. 10(c).

Figure 10D:
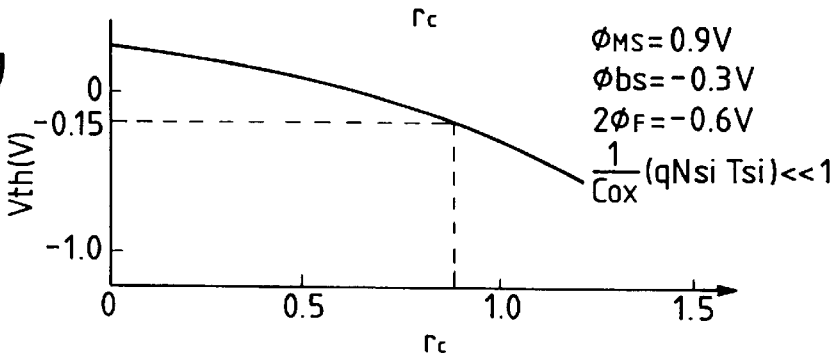

FIG. 10(d) represents a case where the gate electrode $3p_3$ is made from an n-type polysilicon and the lower electrode $3p_4$ is made from a p-type polysilicon (i.e., the first embodiment). Here, $\phi_{MS}$ is set to 0.9 V, $\phi_{bs}$ to −0.3 V and $2\phi_F$ to −0.6 V. In this case, too, the $V_{TH}$ can be controlled by the value of $r_c$. To realize $V_{TH}$=−0.15 V, for example, the $r_c$ needs to be set to about 0.9, as can be seen from FIG. 10(d).

Because in the case of pMOS 3p, too, the semiconductor integrated circuit device of the first embodiment has the gate electrode $3p_3$ and the lower electrode $3p_4$ formed of materials with different work functions, the threshold voltage $V_{TH}$ can be controlled with good controllability when the device is operated at low power supply voltages.

Next, the setting range of the above-mentioned $r_c$ is explained.

First, when the impurity concentration in the semiconductor layer 1c is sufficiently low and when the threshold voltage $V_{TH}$ of the nMIS 3n is set to 0.15–0.5 V ($V_{cc}$=1/10 of 1.5–5 V), the setting range will be as follows from FIG. 8 and FIG. 10.

That is, when the material of the gate electrode $3n_3$ is an n-type polysilicon and that of the lower electrode $3n_4$ is a p-type polysilicon, then $r_c \leq 0.4$ (Equation 1).

When the material of the gate electrode $3n_3$ is a p-type polysilicon and that of the lower electrode $3n_4$ is an n-type polysilicon, then $r_c \leq 0.5$ (Equation 2).

When, on the other hand, the threshold voltage $V_{TH}$ of the pMIS 3p is set to −0.15 V to −0.5 V ($V_{cc}$=1/10 of 1.5–5 V), the setting range will be as follows.

That is, when the material of the gate electrode $3p_3$ is an n-type polysilicon and that of the lower electrode $3p_4$ is a p-type polysilicon, then $0.8 \leq r_c \leq 1.2$ (Equation 3).

When the material of the gate electrode $3p_3$ is a p-type polysilicon and that of the lower electrode $3p_4$ is an n-type polysilicon, then $1.0 \leq r_c \leq 1.2$ (Equation 4).

Therefore, a value of $r_c$ does not exist which satisfies the combined requirements of Equation 1 and Equation 3 and those of Equation 2 and Equation 4. However, where it is possible to make a setting in the range of about ±0.3 V by the control of impurity concentration in the semiconductor layer 1c and when the threshold voltage $V_{TH}$ of the nMIS 3n is set to 0.15–0.5 V ($V_{cc}$=1/10 of 1.5–5 V), the $r_c$ setting range will be as follows.

That is, when the material of the gate electrode $3n_3$ is an n-type polysilicon and that of the lower electrode $3n_4$ is a p-type polysilicon, then $0.3 \leq r_c \leq 1.2$ (Equation 5).

When the material of the gate electrode $3n_3$ is a p-type polysilicon and that of the lower electrode $3n_4$ is an n-type polysilicon, then $r_c \leq 0.8$ (Equation 6).

When, on the other hand, the threshold voltage $V_{TH}$ of the pMIS 3p is set to –0.15 V to –0.5 V ($V_{cc}$=1/10 of 1.5–5 V), the setting range will be as follows.

That is, when the material of the gate electrode $3p_3$ is an n-type polysilicon and that of the lower electrode $3p_4$ is a p-type polysilicon, then $0.3 \leq r_c \leq 0.9$ (Equation 7).

When the material of the gate electrode $3p_3$ is a p-type polysilicon and that of the lower electrode $3p_4$ is an n-type polysilicon, then $0.3 \leq r_c \leq 0.9$ (Equation 8).

Therefore, to keep the threshold voltage $V_{TH}$ of the nMIS 3n and pMIS 3p (absolute value) in the 0.15–0.5 V range, the value of $r_c$ should be set in the following range.

That is, when the material of the gate electrode $3n_3$, $3p_3$ is an n-type polysilicon and that of the lower electrode $3n_4$, $3p_4$ is a p-type polysilicon, then $0.3 \leq r_c \leq 0.9$ (Equation 9).

When the material of the gate electrode $3n_3$, $3p_3$ is a p-type polysilicon and that of the lower electrode $3n_4$, $3p_4$ is an n-type polysilicon, then $0.3 \leq r_c \leq 0.8$ (Equation 10).

Next, an example method of manufacturing the semiconductor integrated circuit device of the first embodiment will be described by referring to FIG. 11 through FIG. 19. For simplicity, the following description concerns a case of forming only the nMIS 3n on the SOI substrate.

Figure 11:
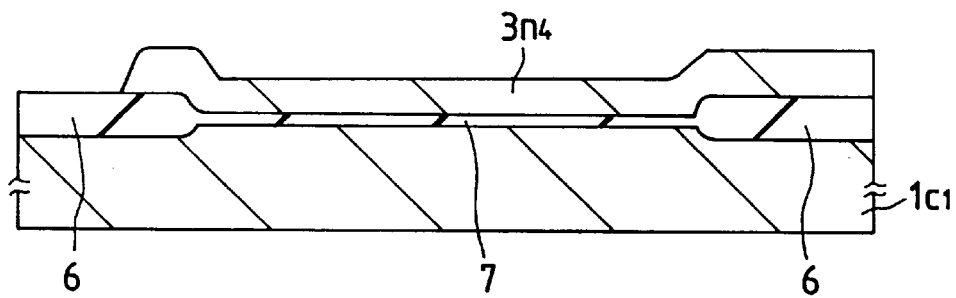
FIG. 11 is a fragmentary cross section of the semiconductor integrated circuit device of FIG. 1(a) in the manufacture process.

First, as shown in FIG. 11, on the main surface of a semiconductor substrate $1c_1$ made from a p-type monocrystal silicon are formed field insulating films 6 by a selective oxidation, after which an insulating film 7 is formed between the adjacent field insulating films 6. The insulating film 7 is formed by thermally oxidizing the main surface of the semiconductor substrate $1c_1$.

Then, on the field insulating film 6 and the insulating film 7 a conductive film of n-type polysilicon is deposited by a CVD method, after which it is patterned by photolithography to form the lower electrode $3n_4$. The n-type polysilicon is a polysilicon film doped with antimony (Sb), phosphorus (P) or arsenic (As).

Figure 12:
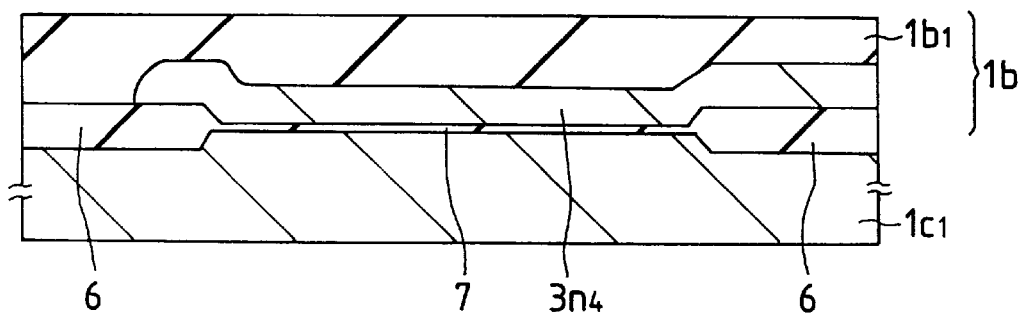
FIG. 12 is a fragmentary cross section of the semiconductor integrated circuit device of FIG. 1(a) in the manufacture process following FIG. 11.

After this, as shown in FIG. 12, an insulating film $1b_1$ made, for example, of a BPSG (boron-doped phosphosilicate glass) is formed over the semiconductor substrate $1c_1$. The above-mentioned insulating layer 1b is formed by the field insulating film 6, the insulating film 7 and the insulating film $1b_1$.

Figure 13:
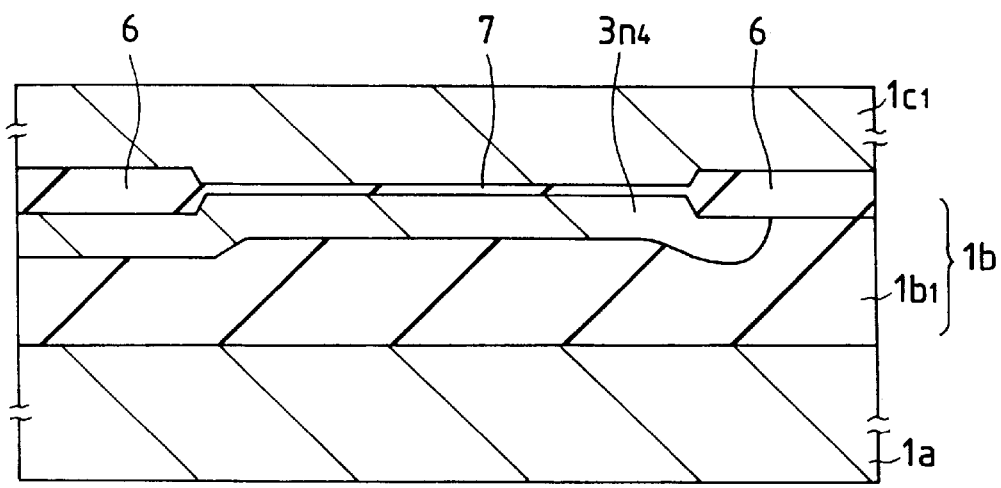
FIG. 13 is a fragmentary cross section of the semiconductor integrated circuit device of FIG. 1(a) in the manufacture process following FIG. 12.

Next, as shown in FIG. 13, the semiconductor substrate $1c_1$ is bonded by heat treatment to another semiconductor substrate 1a (wafer), with the insulating film $1b_1$ of the semiconductor substrate $1c_1$ interposed therebetween (wafer bonding process). This heat treatment is done at high temperatures, for example, 900° C. The semiconductor substrate 1a may be formed of a p-type monocrystal silicon.

Figure 14:
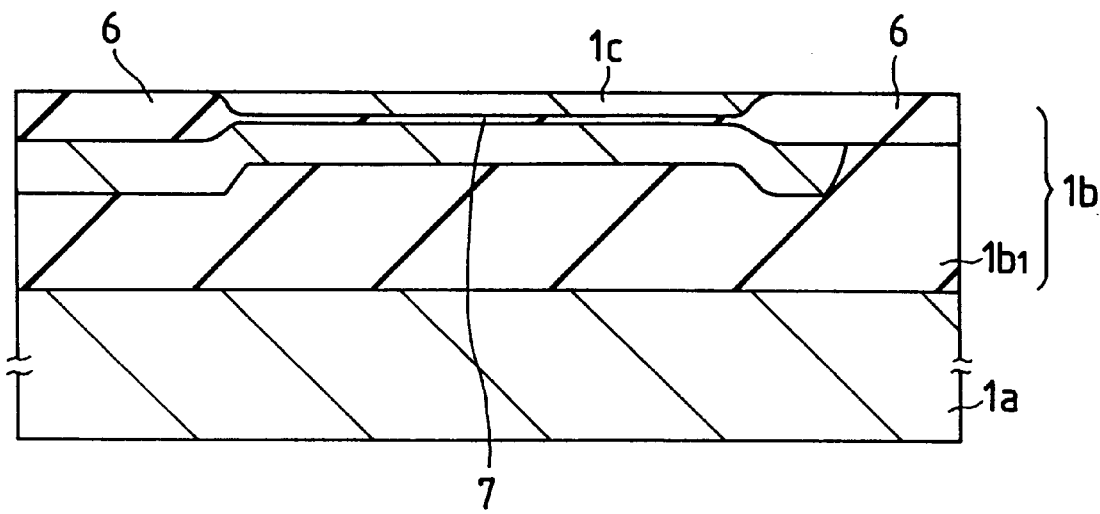
FIG. 14 is a fragmentary cross section of the semiconductor integrated circuit device of FIG. 1(a) in the manufacture process following FIG. 13.

Next, as shown in FIG. 14, the back of the semiconductor substrate $1c_1$ is polished to such a degree that the field insulating film 6 is exposed. In this way, the semiconductor layer 1c is formed.

Figure 15:
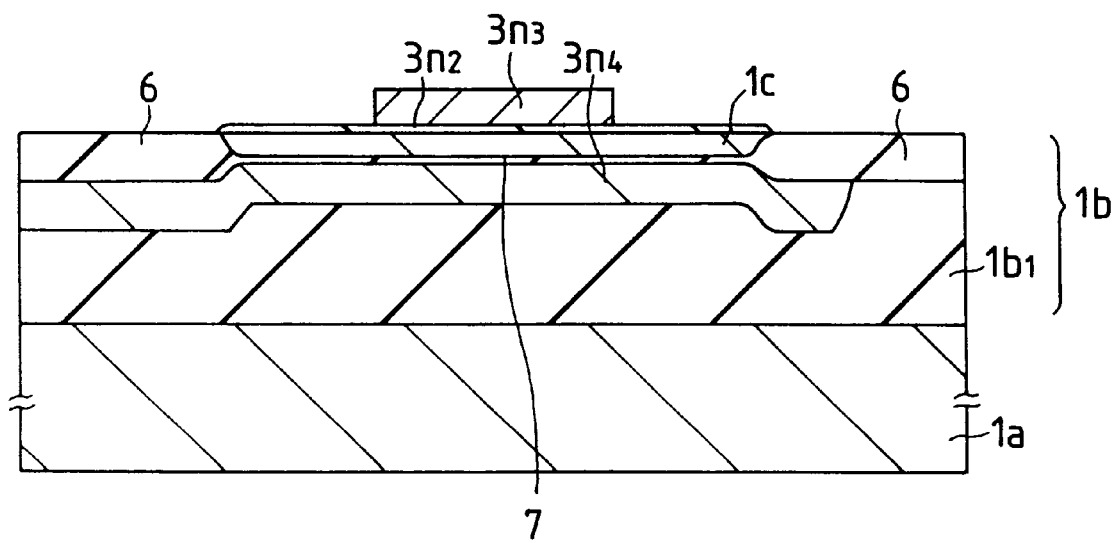
FIG. 15 is a fragmentary cross section of the semiconductor integrated circuit device of FIG. 1(a) in the manufacture process following FIG. 14.

Then, as shown in FIG. 15, the upper surface of the semiconductor layer 1c is oxidized to form the gate insulating film $3n_2$ over the semiconductor layer 1c, after which a polysilicon is deposited by the CVD over the semiconductor layer 1c and the field insulating film 6.

Next, the polysilicon gate electrode forming region of nMIS 3n is doped with a p-type impurity such as boron (B) and is patterned by photolithography to form the gate electrode $3n_3$ over the semiconductor layer 1c. It is also possible to form a gate electrode $3n_3$ of n-type polysilicon by introducing an n-type impurity such as phosphorus or arsenic.

Figure 16:
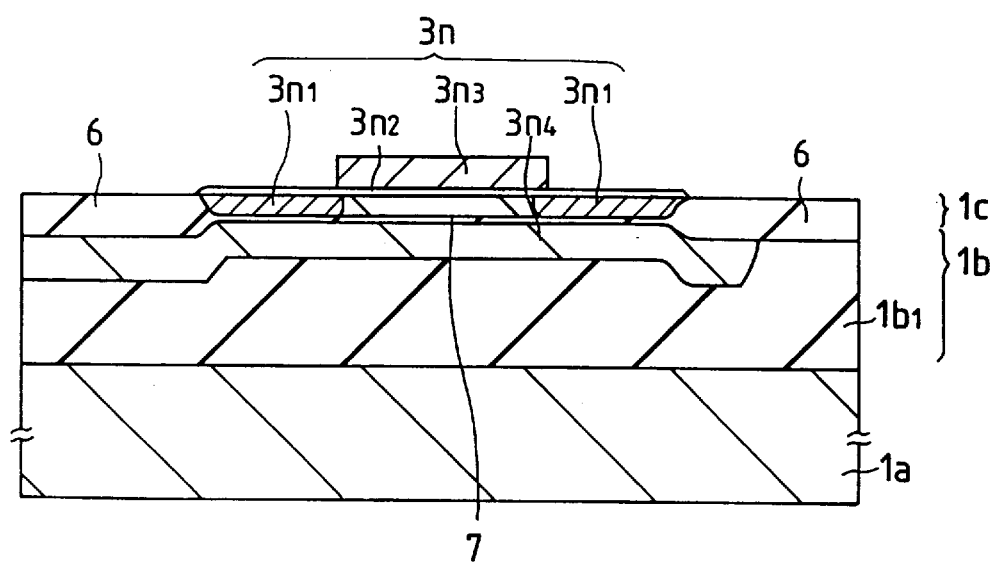
FIG. 16 is a fragmentary cross section of the semiconductor integrated circuit device of FIG. 1(a) in the manufacture process following FIG. 15.

Then, as shown in FIG. 16, with the gate electrode $3n_3$ as a mask, an n-type impurity such as arsenic (As) is introduced into the semiconductor layer 1c by ion implantation to form a pair of diffusion layers $3n_1$, $3n_1$ in the semiconductor layer 1c on both sides of the gate electrode $3n_3$. In this way, an nMIS 3n is formed over the semiconductor layer 1c.

Figure 17:
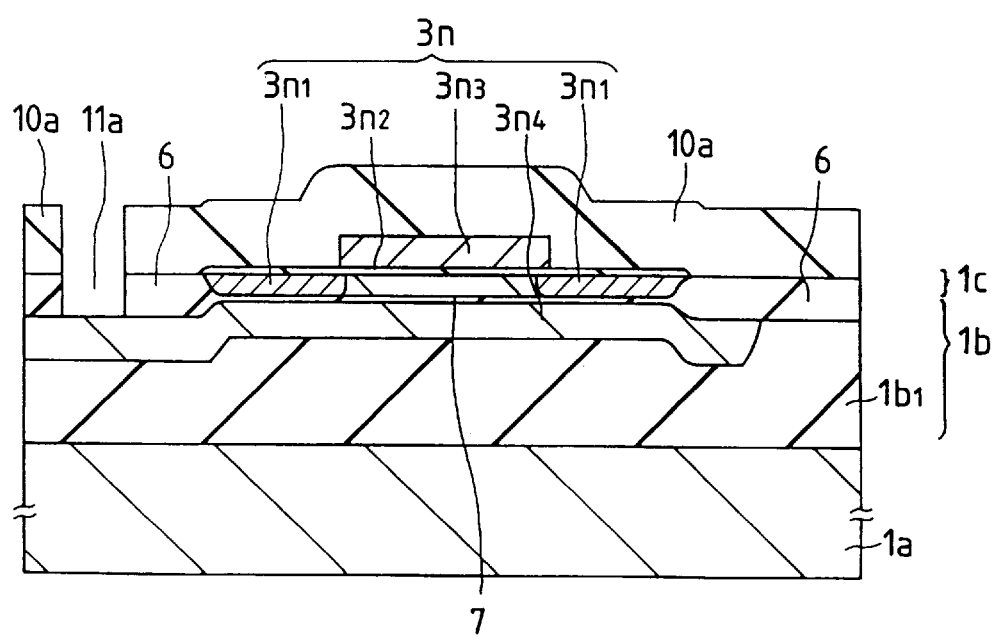
FIG. 17 is a fragmentary cross section of the semiconductor integrated circuit device of FIG. 1(a) in the manufacture process following FIG. 16.

After this, as shown in FIG. 17, a photoresist pattern 10a is formed over the semiconductor layer 1c, the field insulating film 6 and the gate electrode $3n_3$. With the photoresist pattern 10a as a mask, a through-hole 11a reaching the lower electrode $3n_4$ is formed in the field insulating film 6.

Figure 18:
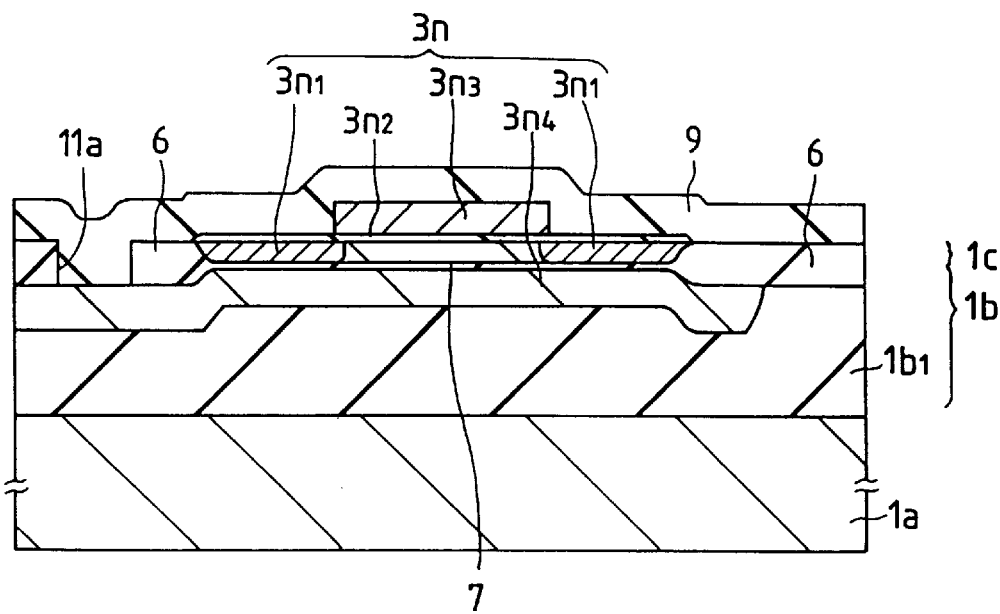
FIG. 18 is a fragmentary cross section of the semiconductor integrated circuit device of FIG. 1(a) in the manufacture process following FIG. 17.

Then, as shown in FIG. 18, an insulating film 9 formed of, say, PSG (phospho-silicate glass) or BPSG is deposited over the semiconductor layer 1c, the field insulating film 6, the through-hole 11a and the gate electrode $3n_3$.

Figure 19:
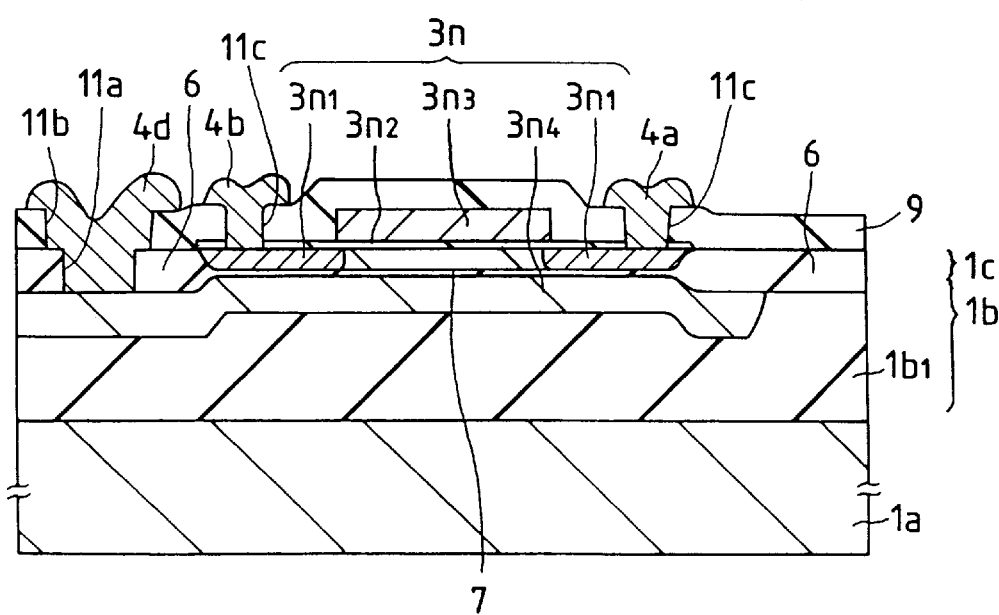
FIG. 19 is a fragmentary cross section of the semiconductor integrated circuit device of FIG. 1(a) in the manufacture process following FIG. 18.

Then, as shown in FIG. 19, a through-hole 11b reaching the lower electrode $3n_4$ is formed in the insulating film 9 at a position of the through-hole 11a. At the same time, through-holes 11c reaching the diffusion layers $3n_1$, $3n_1$ are also formed in the insulating film 9 at locations over the diffusion layers $3n_1$, $3n_1$. This is followed by the deposition over the insulating film 9 of a conductive film of Al—Si—Cu alloy.

After this, the conductive film is patterned by photolithography to form leadout electrodes 4a, 4b, 4d and interconnects.

In the manufacturing method of nMIS 3n, after the lower electrode $3n_4$ is formed of an n-type polysilicon film, wafers are bonded together and then the gate electrode $3n_3$ of p-type polysilicon film is formed.

Because the wafer bonding is done by heat treatment at high temperatures after the lower electrode $3n_4$ is made from an n-type polysilicon film, the amount of impurity in the polysilicon film that enters through the insulating film 7 into the p-type semiconductor substrate $1c_1$ can be reduced, when compared with a case where the wafer bonding is performed after the lower electrode is formed of a p-type polysilicon film. This reduces variations in the impurity concentration in the semiconductor layer 1c that forms the channel region of the nMIS 3n and facilitates the control of the threshold voltage.

To described in more detail, when the lower electrode is formed of a p-type polysilicon film doped with such an impurity as boron, heat treatment during the wafer bonding process causes the boron (impurity) in the p-type polysilicon enters through the insulating film 7 into the p-type semiconductor layer 1c, increasing the impurity concentration in the channel region of the nMIS 3n. As a result, the impurity concentration in the channel region varies, making the control of threshold voltage difficult.

Therefore, in making the nMIS 3n whose gate electrode $3n_3$ and lower electrode $3n_4$ are formed of materials with different work functions by using a wafer bonding process, the controllability of the threshold voltage can be improved by forming the lower electrode $3n_4$ with an n-type polysilicon film, performing the wafer bonding, and by forming the upper gate electrode $3n_3$ with a p-type polysilicon film.

The first embodiment, therefore, offers the following advantages.

(1) The gate electrodes $3n_3$, $3p_3$ and the lower electrodes $3n_4$, $3p_4$ of the nMIS 3n and pMIS 3p are made from materials with different work functions to control the state of the channel regions being formed in the nMIS 3n and pMIS 3p. This makes it possible to further improve the controllability of the threshold voltage of the nMIS 3n and pMIS 3p.

(2) The thickness ratio between the gate insulating films 3nsb2, 3$p_2$ and the insulating film 7 (an insulating film between the semiconductor layer 1c and the lower electrodes 3$n_4$, 3$p_4$) in the nMIS 3n and pMIS 3p is set to a specified value to control the state of the channel regions being formed in the nMIS 3n and pMIS 3p. This further improves the controllability of the threshold voltage of the nMIS 3n and pMIS 3p.

(3) In the insulating layer 1b of the SOI substrate, the lower electrodes 3$n_4$, 3$p_4$ are formed beneath the nMIS 3n and pMIS 3p formed in the semiconductor layer 1c so that they can be applied a specified fixed bias voltage. This further improves the controllability of the threshold voltage of the nMIS 3n and pMIS 3p.

(4) Electrical connection between the gate electrodes 3$n_3$, 3$p_3$ and the lower electrodes 3$n_4$, 3$p_4$ allows the transfer conductance of the nMIS 3n and pMIS 3p to be increased and therefore the drive capability of the nMIS 3n and pMIS 3p to be improved substantially. By forming an output circuit with the nMIS 3n and pMIS 3p, it is possible to improve the performance and reliability of the semiconductor integrated circuit device.

(5) Because a common fixed bias supply voltage can be supplied to a plurality of nMIS's 3n and pMIS's 3p in the internal circuit region A, there is no need to provide a fixed bias supply voltage terminal to each nMIS 3n or pMIS 3p. Rather, the fixed bias supply voltage terminal needs to be provided to each circuit block in the internal circuit region A, allowing the fixed bias supply voltage to be applied without deteriorating the integration level of the semiconductor IC circuits.

(6) It is possible not only to make effective the threshold voltage-fixed bias supply voltage characteristic by reducing the thickness of only the insulating film 7 between the semiconductor layer 1c and the lower electrodes 3$n_4$, 3$p_4$ but also to reduce the parasitic capacitance by increasing the thickness of other insulating film (field insulating film 6) than the insulating film 7.

(7) After the lower electrode 3$n_4$ is formed of an n-type polysilicon film, the wafer bonding is done, followed by the upper gate electrode 3$n_3$ being formed of a p-type polysilicon film. This makes it possible to improve the controllability of the threshold voltage of the nMIS 3n.

(8) These advantages (1) to (7) combine to make it possible to provide a semiconductor integrated circuit device having high performance and reliability.

(Embodiment 2)

Figure 20:
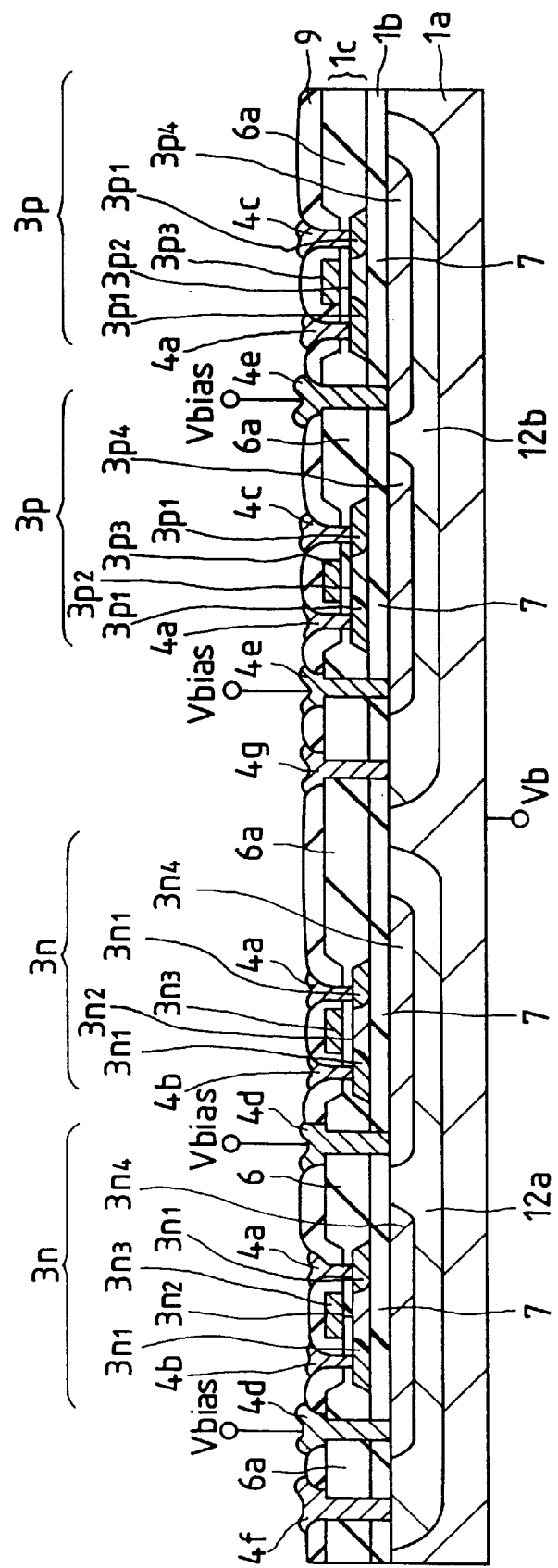
FIG. 20 is a fragmentary cross section showing a semiconductor integrated circuit device as another embodiment of this invention.
Figure 21:
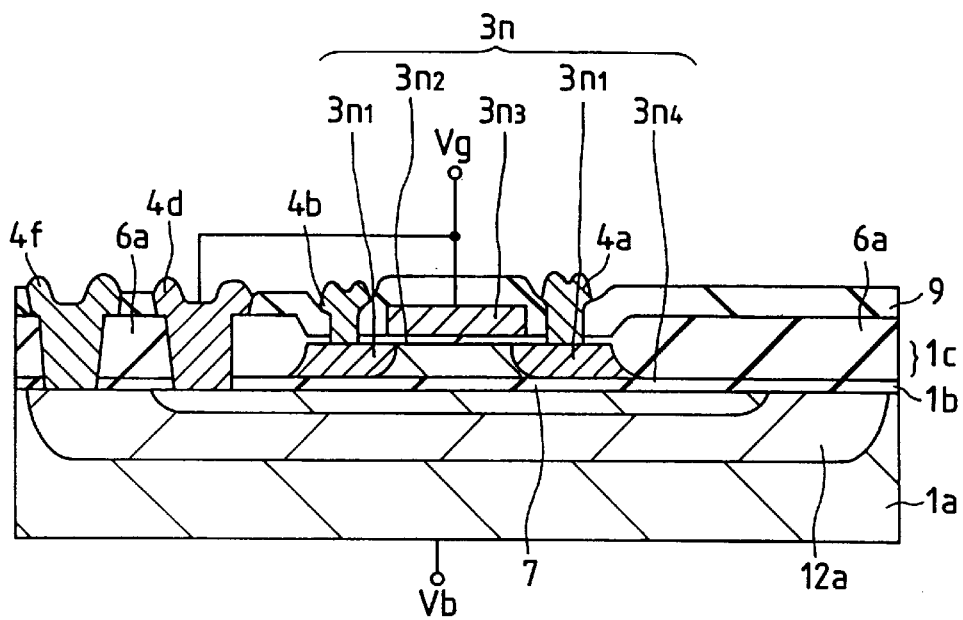
FIG. 21 is a fragmentary cross section of the second embodiment of the semiconductor integrated circuit device.

FIGS. 20 and 21 are cross sections showing essential portions of the semiconductor integrated circuit device as another embodiment of this, invention. FIGS. 22 through 30 are fragmentary cross sections of the semiconductor integrated circuit device of the second embodiment in a series of steps of the manufacturing process.

In the second embodiment, as shown in FIG. 20, the lower electrodes 3$n_4$, 3$p_4$ are made from a diffusion layer formed at the top of the semiconductor substrate 1a beneath the nMIS 3n and pMIS 3p. The fixed bias supply voltage applied from the fixed bias supply voltage interconnect $V_{bias}$ to the lower electrodes 3$n_4$, 3$p_4$ and the substrate voltage $V_b$ applied to the semiconductor substrate 1a are so set that the junction between the lower electrodes 3$n_4$, 3$p_4$ and the semiconductor substrate 1a is always reverse-biased.

The lower electrodes 3$n_4$, 3$p_4$ are made from a material with a work function different from that of the gate electrodes 3$n_3$, 3$p_3$, the material being doped with such a p-type impurity as boron. The gate electrodes 3$n_3$, 3$p_3$ may be made from an n-type polysilicon as in the first embodiment.

In the second embodiment, a plurality of lower electrodes 3$n_4$ of nMIS's 3n are formed in a well 12a and a plurality of lower electrodes 3$p_4$ of pMIS's 3p are formed in a well 12b. The wells 12a, 12b are doped with an n-type impurity such as As, and are electrically connected with electrodes 4f, 4g so that they can be set to a desired potential.

This structure makes it easy to control potential setting of the lower electrodes 3$n_4$, 3$p_4$ and also allows a specified bias voltage to be applied to individual MISFET's when there are two or more MISFET's.

As shown in FIG. 21, in the nMIS 3n in the external circuit region B (see FIG. 2), the gate electrode 3$n_3$ and the lower electrode 3$n_4$ are electrically connected. This makes the transfer conductance of the nMIS 3n in the external circuit region B approximately two times greater than that of the nMIS 3n in the internal circuit region A (see FIG. 2).

Denoted 6a is a field insulating film, which, unlike the first embodiment, does not constitute an insulating layer 1b.

Next, by referring to FIG. 22 through FIG. 30, an example method of manufacturing the semiconductor integrated circuit device of the second embodiment will be described. For simplicity, the manufacturing method concerns a case of forming only the nMIS 3n on the SOI substrate.

Figure 22:
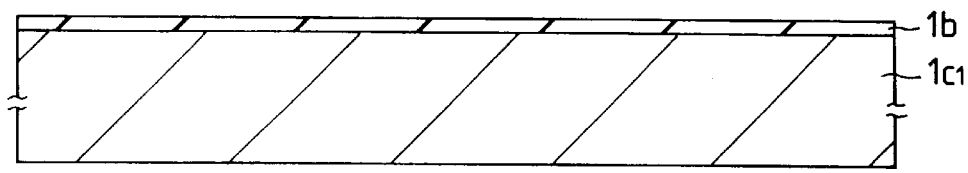
FIG. 22 is a fragmentary cross section of the semiconductor integrated circuit device of FIG. 20 in the manufacture process.

First, as shown in FIG. 22, a semiconductor substrate 1$c_1$ of a p-type monocrystal silicon is oxidized to form an insulating layer 1b over the main surface of the semiconductor substrate 1$c_1$.

Figure 23:
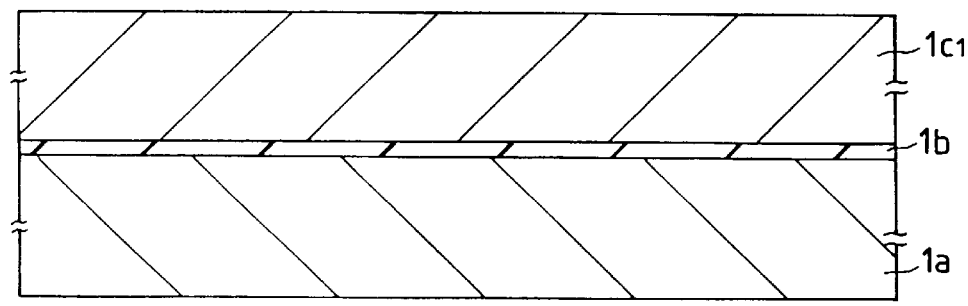
FIG. 23 is a fragmentary cross section of the semiconductor integrated circuit device of FIG. 20 in the manufacture process following FIG. 22.

Next, as shown in FIG. 23, the semiconductor substrate 1$c_1$ is bonded to another semiconductor substrate 1a by a thermal processing, with the insulating layer 1b interposed therebetween. The semiconductor substrate 1a may be formed of a p-type monocrystal silicon.

Figure 24:
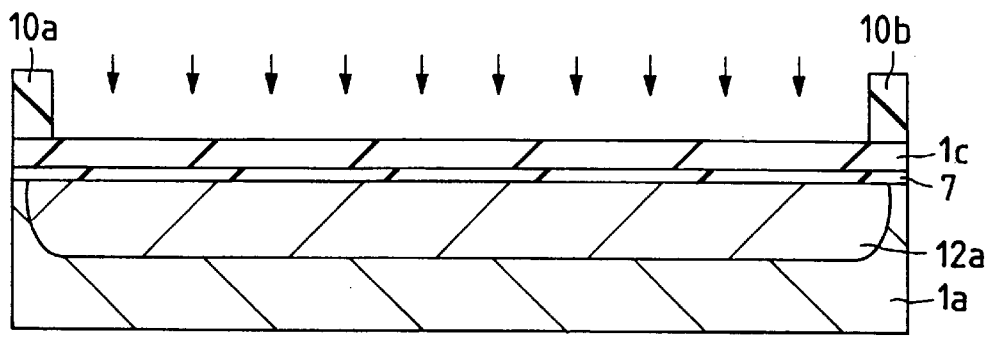
FIG. 24 is a fragmentary cross section of the semiconductor integrated circuit device of FIG. 20 in the manufacture process following FIG. 23.

Then, as shown in FIG. 24, the back of the semiconductor substrate 1$c_1$ is polished to form a semiconductor layer 1c, which is then deposited with a photoresist pattern 10b by a photolithography.

Next, with the photoresist pattern 10b as a mask, an n-type impurity such as arsenic (As) is introduced into the top portion of the semiconductor substrate 1a to form a well 12a.

Figure 25:
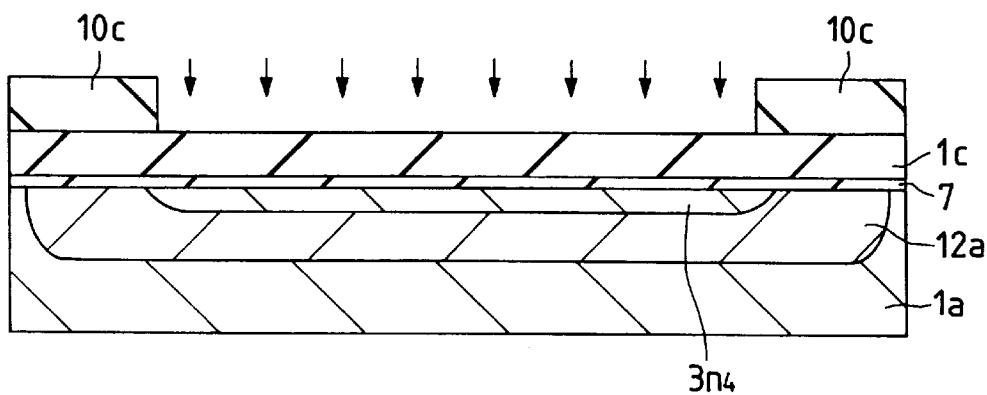
FIG. 25 is a fragmentary cross section of the semiconductor integrated circuit device of FIG. 20 in the manufacture process following FIG. 24.

After the photoresist pattern 10b is removed, another photoresist pattern 10c is formed over the semiconductor layer 1c by a photolithography, as shown in FIG. 25.

With the photoresist pattern 10c as a mask, a p-type impurity such as boron is introduced into the well 12a in the upper part of the semiconductor substrate 1a to form a lower electrode 3$n_4$.

Figure 26:
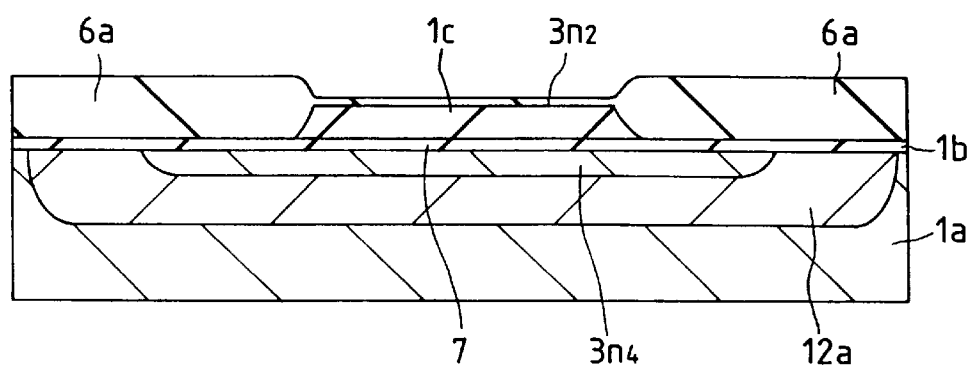
FIG. 26 is a fragmentary cross section of the semiconductor integrated circuit device of FIG. 20 in the manufacture process following FIG. 25.

Next, as shown in FIG. 26, the semiconductor layer 1c is selectively oxidized to form a field insulating film 6a. Then, a gate insulating film 3$n_2$ is formed in a device forming region enclosed by the field insulating film 6a.

Figure 27:
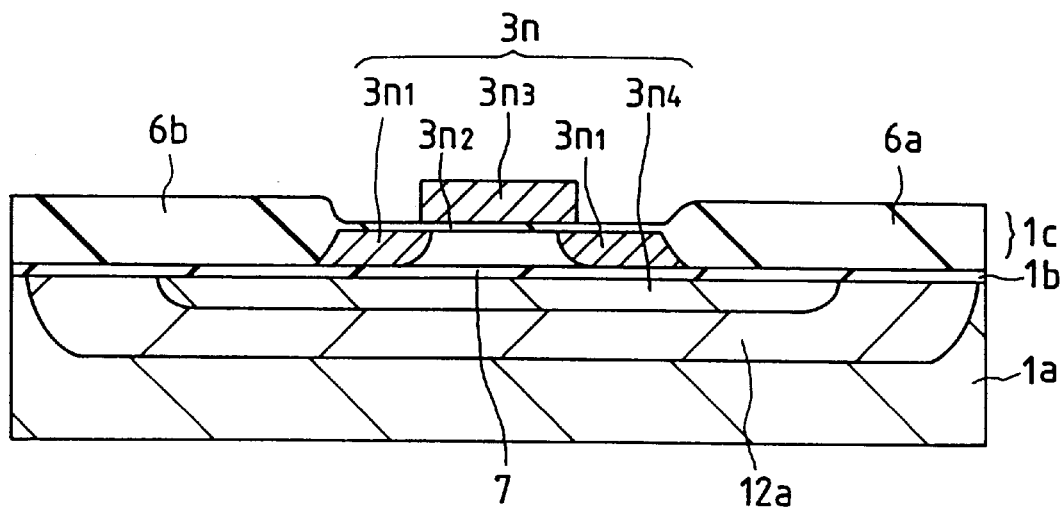
FIG. 27 is a fragmentary cross section of the semiconductor integrated circuit device of FIG. 20 in the manufacture process following FIG. 26.

Then, as shown in FIG. 27, a polysilicon is deposited over the semiconductor layer 1c and the field insulating film 6a, after which an n-type impurity such as phosphorus is introduced in a gate electrode forming region of the polysilicon.

After this, the polysilicon is patterned by photolithography to form a gate electrode 3$n_3$ over the semiconductor layer 1c. With the gate electrode 3$n_3$ as a mask, an n-type impurity such as arsenic (As) is introduced into the semiconductor layer 1c as by ion-implantation to form a pair of diffusion layers 3$n_1$, 3$n_1$ in the semiconductor layer 1c on both sides of the gate electrode 3$n_3$. As a result, an nMIS 3n is formed on the semiconductor layer 1c.

Figure 28:
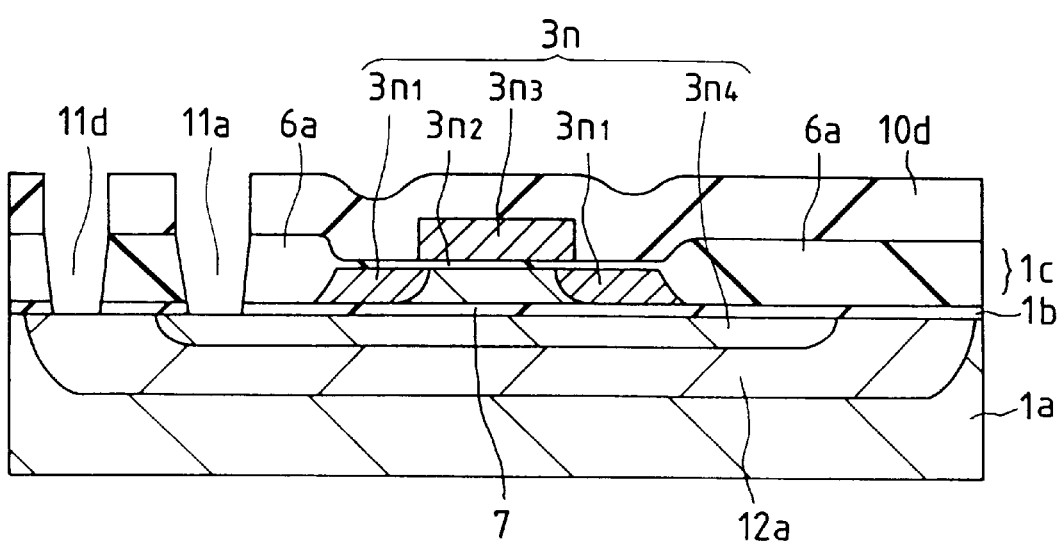
FIG. 28 is a fragmentary cross section of the semiconductor integrated circuit device of FIG. 20 in the manufacture process following FIG. 27.
Figure 29:
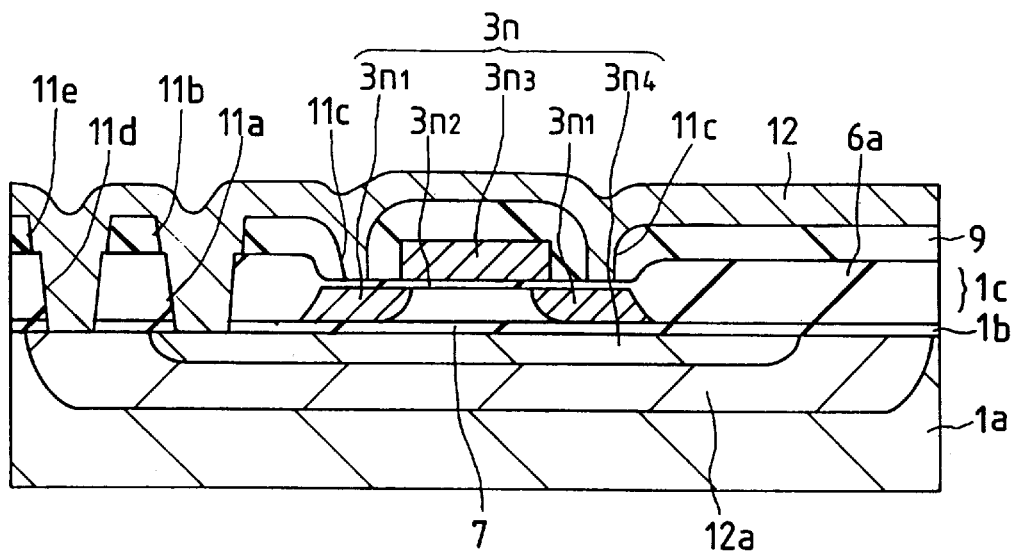
FIG. 29 is a fragmentary cross section of the semiconductor integrated circuit device of FIG. 20 in the manufacture process following FIG. 28.

Next, as shown in FIG. 28, a photoresist pattern 10d is formed over the semiconductor layer 1c, field insulating film 6a and gate electrode $3n_3$. With the photoresist pattern 10d as a mask, through-holes 11a, 11d reaching the lower electrode $3n_4$ and the well 12a are formed in the field insulating film 6a.

Next, after the photoresist pattern 10d is removed, an insulating film 9 made of PSG or BPSG is deposited over the semiconductor layer 1c, field insulating film 6a, through-holes 11a, 11d and gate electrode $3n_3$.

Figure 30:
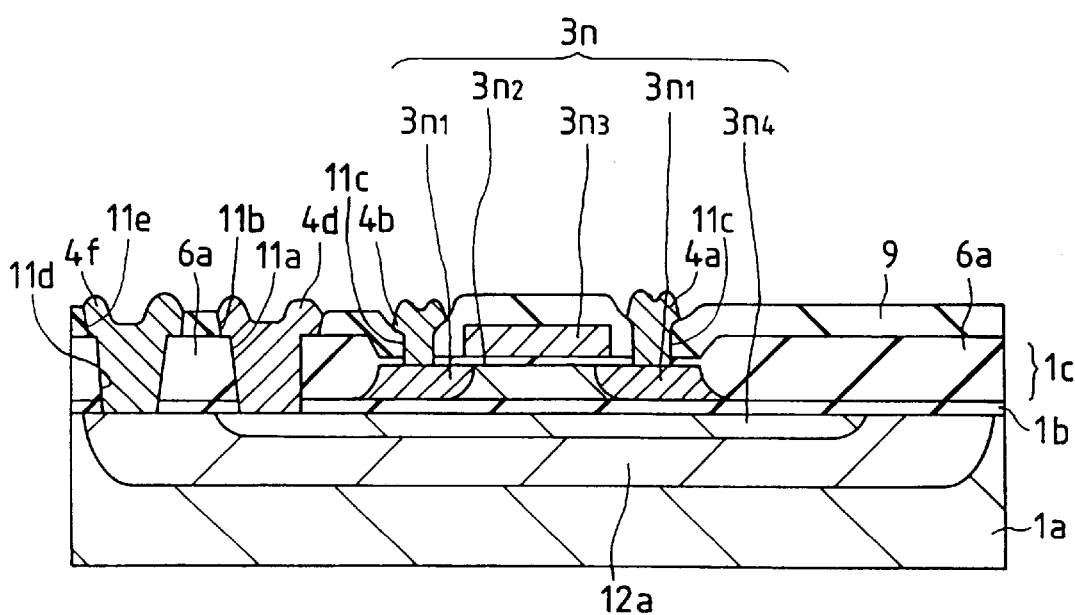
FIG. 30 is a fragmentary cross section of the semiconductor integrated circuit device of FIG. 20 in the manufacture process following FIG. 29.

The insulating film 9 is then formed with through holes 11b, 11e reaching the well 12a and with through-holes 11c reaching the diffusion layers $3n_1$, $3n_1$. After this, a conductive film 12 made, for example, of Al—Si—Cu alloy is deposited over the insulating film 9. Then, the conductive film 12 is patterned by photolithography to form leadout electrodes 4a, 4b, 4d, 4f, as shown in FIG. 30.

In this way, the same advantage as the first embodiment can be obtained in this second embodiment, too. In the manufacture method for the second embodiment, because, after the wafers are bonded together, the well 12a, the lower electrode $3n_4$ and the upper gate electrode $3n_3$ are formed successively, the threshold voltage is prevented from varying, as would otherwise be caused by thermal processing in the wafer bonding process.

(Embodiment 3)

Figure 31:
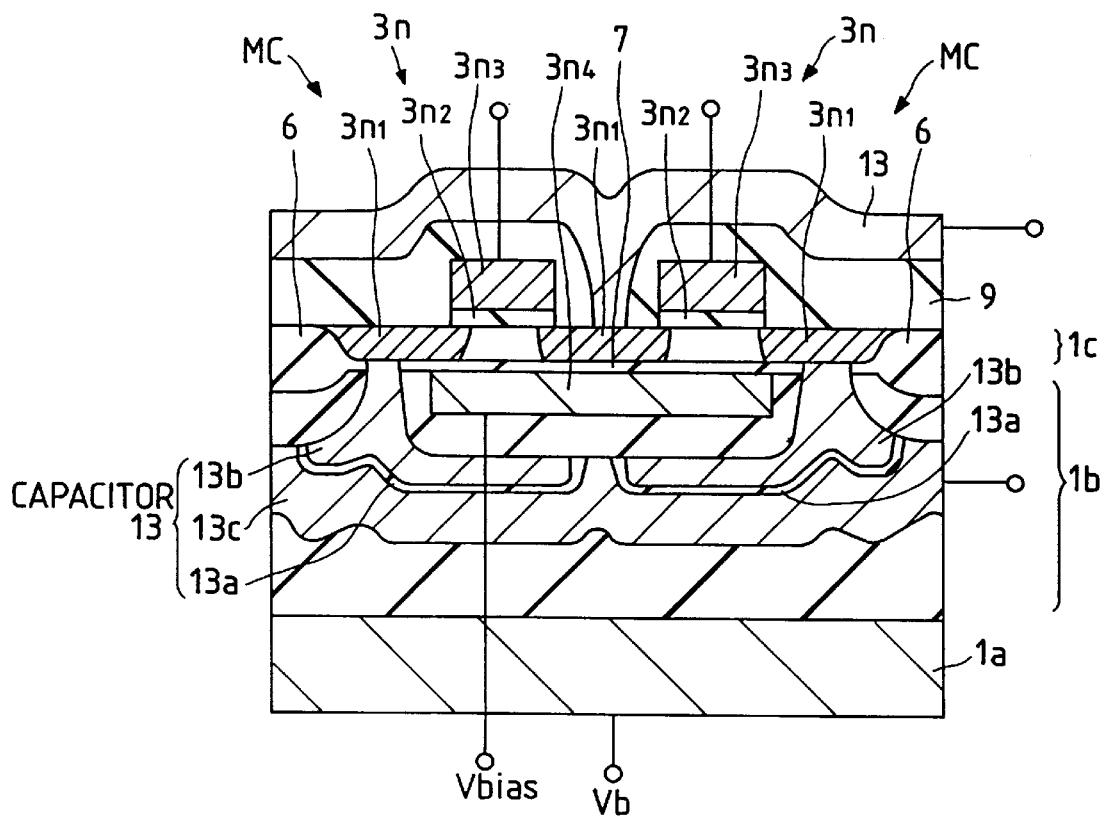
FIG. 31 is a fragmentary cross section of another embodiment of the semiconductor integrated circuit device according to this invention.

FIG. 31 is a cross section showing an essential portion of the semiconductor integrated circuit device as a further embodiment of this invention.

The semiconductor integrated circuit device of the third embodiment may, for example, be a DRAM (Dynamic Random Access Memory). The cross section of a memory cell portion is shown in FIG. 31.

One memory cell MC may consist of an nMIS $3n$ and a capacitor 13.

The nMIS $3n$ is formed over the semiconductor layer 1c and has a pair of diffusion layers $3n_1$, $3n_1$, a gate insulating film $3n_2$ and a gate electrode $3n_3$. In FIG. 31, two nMIS's $3n$, i.e. two memory cells MC, are shown.

The diffusion layer $3n_1$ is introduced with an n-type impurity such as arsenic (As), as in the first and second embodiment. The concentration of the impurity is approximately $1 \times 10^{20}$ atoms/cm$^3$. The center diffusion layer $3n_1$ serves as a common diffusion layer for the two nMIS's $3n$ and is electrically connected to a data line DL, which may be made from Al—Si—Cu alloy, for example.

The gate electrode $3n_3$ may be formed of a p-type polysilicon and constitutes a part of a word line. A boron may be introduced as a p-type impurity at a concentration of about $1 \times 10^{20}$ atoms/cm$^3$.

In this third embodiment, too, the insulating layer 1b has a lower electrode $3n_4$ therein beneath the two nMIS's $3n$ so that the lower electrode $3n_4$ can be applied a specified fixed bias voltage from the fixed bias supply voltage interconnect $V_{bias}$. This makes it possible to improve the controllability in setting the threshold voltage of the nMIS $3n$ to a desired value, as in the first and second embodiment. The fixed bias voltage may be set to 0 V, for example.

The capacitor 13 is formed in the insulating layer 1b. This structure makes steps, which would be caused when the capacitor 13 was formed over the semiconductor layer 1c, unlikely to form and at the same time makes software errors caused by alpha rays difficult to occur. Because the capacitor 13 is formed below the nMIS $3n$, the capacitance can be increased without increasing the area occupied by the memory cell MC.

The capacitor 13 consists of two capacitor electrodes 13b, 13c facing each other with a capacitor insulating film 13a interposed therebetween. The capacitor electrodes 13b, 13c may both be formed of an n-type polysilicon. Arsenic may be introduced as an n-type impurity at a concentration level of about $1 \times 10^{20}$ atoms/cm$^3$.

Of the capacitor electrodes 13b, 13c, the upper capacitor electrode 13b is electrically connected to the diffusion layer $3n_1$ of the nMIS. The capacitor electrode 13c serves as a common capacitor electrode for two capacitors. The substrate voltage $V_b$ is set to 0 V, for example.

In this way, the third embodiment offers the following advantages.

(1) Because the capacitor 13 making up the memory cell MC of DRAM is provided in the insulating layer 1b below the semiconductor layer 1c of the SOI substrate, steps that may be caused when the capacitor 13 is formed over the semiconductor layer 1c are rendered difficult to form. This facilitates the manufacture of the semiconductor integrated circuit device and reduce the possibility of line break caused by the steps. As a result, the semiconductor integrated circuit device is highly reliable.

(2) Since the capacitor 13 making up the memory cell MC of DRAM is provided in the insulating layer 1b below the semiconductor layer 1c of the SOI substrate, the memory cell can be made less susceptible to alpha rays. This in turn reduces the possibility of software errors caused by alpha rays, improving the reliability of the semiconductor integrated circuit device.

(3) Because the capacitor 13 making up the memory cell MC of DRAM is provided beneath the nMIS $3n$ forming the memory cell MC, the capacitance of the capacitor 13 can be increased without increasing the area occupied by the memory cell MC.

(4) Because the lower electrode $3n_4$ is provided below the nMIS $3n$ that forms the memory cell MC of DRAM so that the lower electrode $3n_4$ can be applied a specified fixed bias voltage, the controllability in setting the threshold voltage of the nMIS $3n$ to a desired value can be improved.

A DRAM using a conventional SOI structure is introduced in the Tech Dig. 1992, pp803–806, IEDM (International Electron Device Meeting).

(Embodiment 4)

Figure 32:
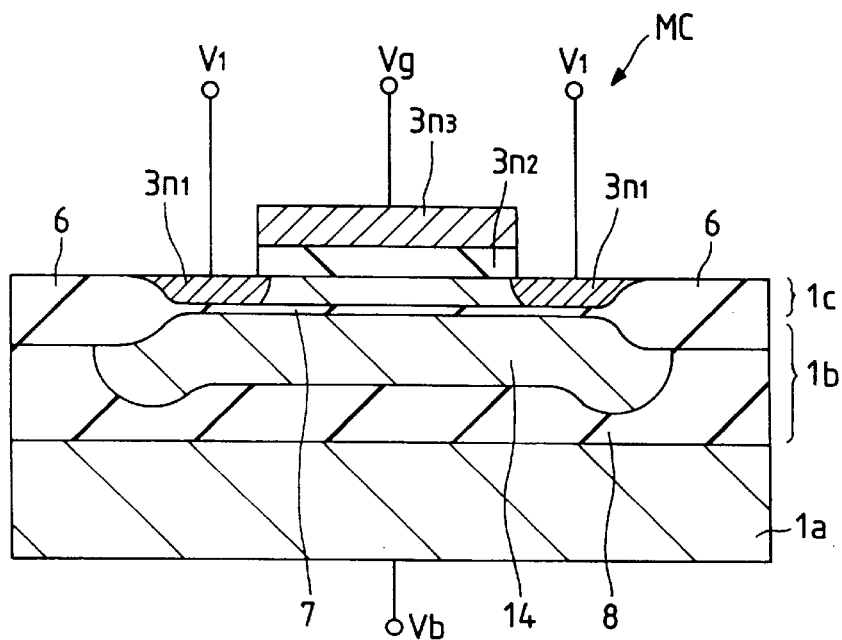
FIG. 32 is a fragmentary cross section of still another embodiment of the semiconductor integrated circuit device.
Figure 33:
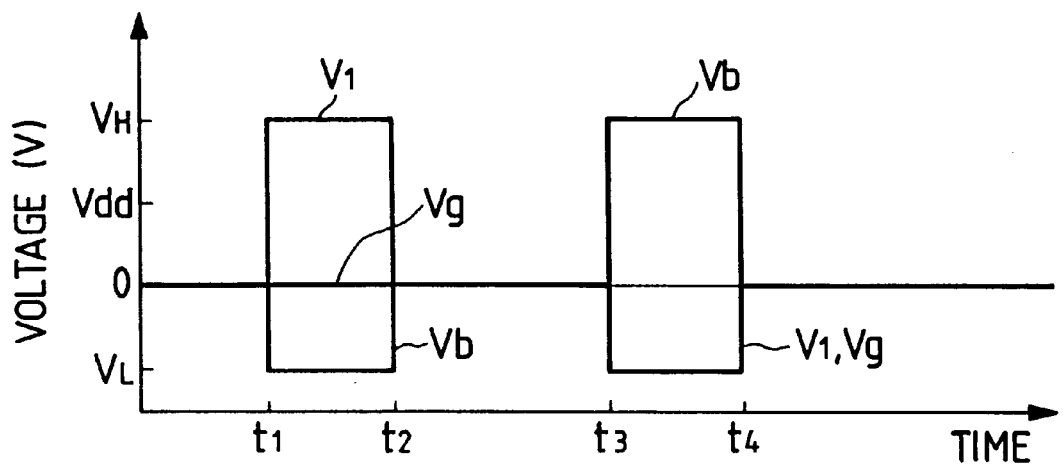
FIG. 33 is a graph showing information write and erase operations in the semiconductor integrated circuit device of FIG. 32.
Figure 34:
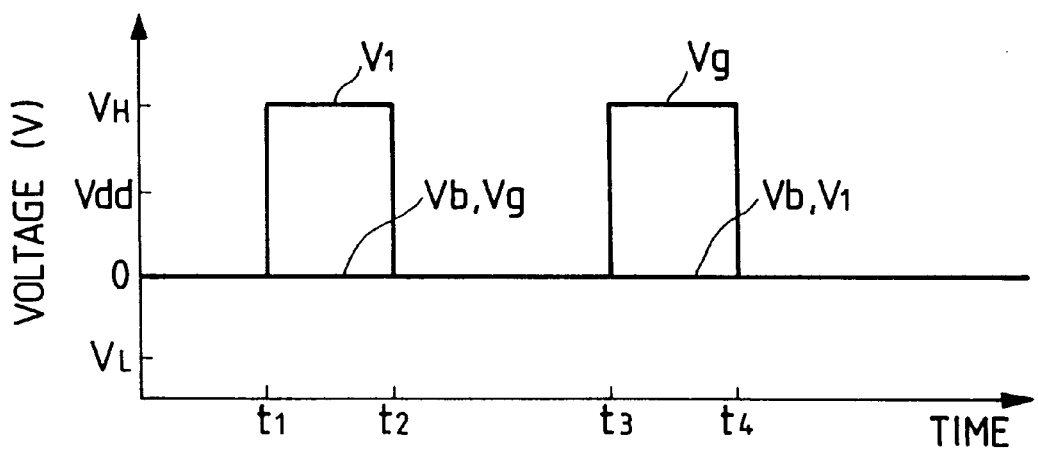
FIG. 34 is a graph showing other information write and erase operations in the semiconductor integrated circuit device of FIG. 32.

FIG. 32 is a cross section showing an essential portion of a further embodiment of the semiconductor integrated circuit device according to this invention. FIGS. 33 and 34 show the operation of information writing and erasure in the semiconductor integrated circuit device of the fourth embodiment.

The semiconductor integrated circuit device of the fourth embodiment may, for example, be an EEPROM (Electrically Erasable Programmable Read Only Memory). The cross section of the memory cell portion is shown in FIG. 32.

In the fourth embodiment, a floating gate 14 making up the memory cell MC of EEPROM is formed in the insulating layer 1b of the SOI substrate. The floating gate 14 is made, for instance, from an n-type polysilicon. Arsenic (As) is introduced as an n-type impurity at a concentration level of about $1 \times 10^{20}$ atoms/cm$^3$.

In this embodiment, information is stored by injecting electrons or positive holes from the semiconductor layer 1c to the floating gate 14 through a tunnel piercing the insulating film 7 (or an avalanche phenomenon) to change a potential of the floating gate 14. Information is erased by releasing the electrons or holes from the floating gate 14 toward the semiconductor layer 1c.

The gate electrode $3n_3$ that functions as a control gate may be formed of a p-type polysilicon. Boron may be introduced as a p-type impurity at a concentration level of about $1 \times 10^{20}$ atoms/cm$^3$. The thickness of the gate insulating film $3n_2$ is about 10 nm and that of the insulating film 7 is about 2 nm. Designated $V_g$ is a voltage applied to the control gate. $V_1$ represents a voltage applied to the diffusion layer $3n_1$.

An example of writing operation is shown in FIGS. 33 and 34. A duration $t_1$–$t_2$ represents the time when information "1" is written and a duration $t_3$–$t_4$ represents the time when information "0" is written.

As shown in FIG. 33, when information "1" is to be written, the gate electrode $3n_3$ is applied 0 V and the substrate voltage $V_b$ is set to a low voltage $V_L$, and in this condition the pair of diffusion layers $3n_1$, $3n_1$ are applied a high voltage $V_H$. When information "0" is to be written, the gate electrode $3n_3$ is applied a low voltage $V_L$, the substrate voltage $V_b$ set to a high voltage $V_H$ and the pair of diffusion layers $3n_1$, $3n_1$ applied a low voltage $V_L$.

In the EEPROM operation, writing the "0" information requires the semiconductor substrate $1a$ to be set high. If it is desired to operate the memory like an EPROM, the information may all be cleared by radiating an ultraviolet ray.

FIG. 34 shows a case where no negative voltage is used. As shown in this figure, when the "1" information is to be written, the gate electrode $3n_3$ is applied 0 V, the substrate voltage $V_b$ set to 0 V, and the pair of diffusion layers $3n_1$, $3n_1$ applied a high voltage $V_H$.

When the "0" information is to be written, the gate electrode $3n_3$ is applied a high voltage $V_H$, the substrate voltage $V_b$ set to 0 V, and then the pair of diffusion layers $3n_1$, $3n_1$ applied 0 V. At this time, by applying a specified amount of energy (i.e., applying voltage), the electric charge in the channel region is made to pass through the insulating film 7, thus writing "0."

In this way, the fourth embodiment can offer the following advantages.

(1) Because the floating gate 14 making up the memory cell MC of EEPROM is provided in the insulating layer $1b$ of the SOI substrate, steps that would be formed if the floating gate 14 were formed over the semiconductor layer $1c$ are rendered difficult to form. This facilitates the manufacture of the semiconductor integrated circuit device and at the same time reduces the possibility of line break caused by such steps. The reliability of the semiconductor integrated circuit device is therefore enhanced.

(2) Because the floating gate 14 making up the memory cell MC of EEPROM is provided in the insulating layer $1b$ of the SOI substrate, the memory cell can be made less susceptible to alpha rays, reducing the possibility of software errors caused by alpha rays, improving the reliability of the semiconductor integrated circuit device.

The EPROM and EEPROM (flash memory) using a conventional SOI structure is introduced, for example, in the 1992 Symposium on VLSI Technology Digest of Technical Papers, pp44–45.

(Embodiment 5)

Figure 35:
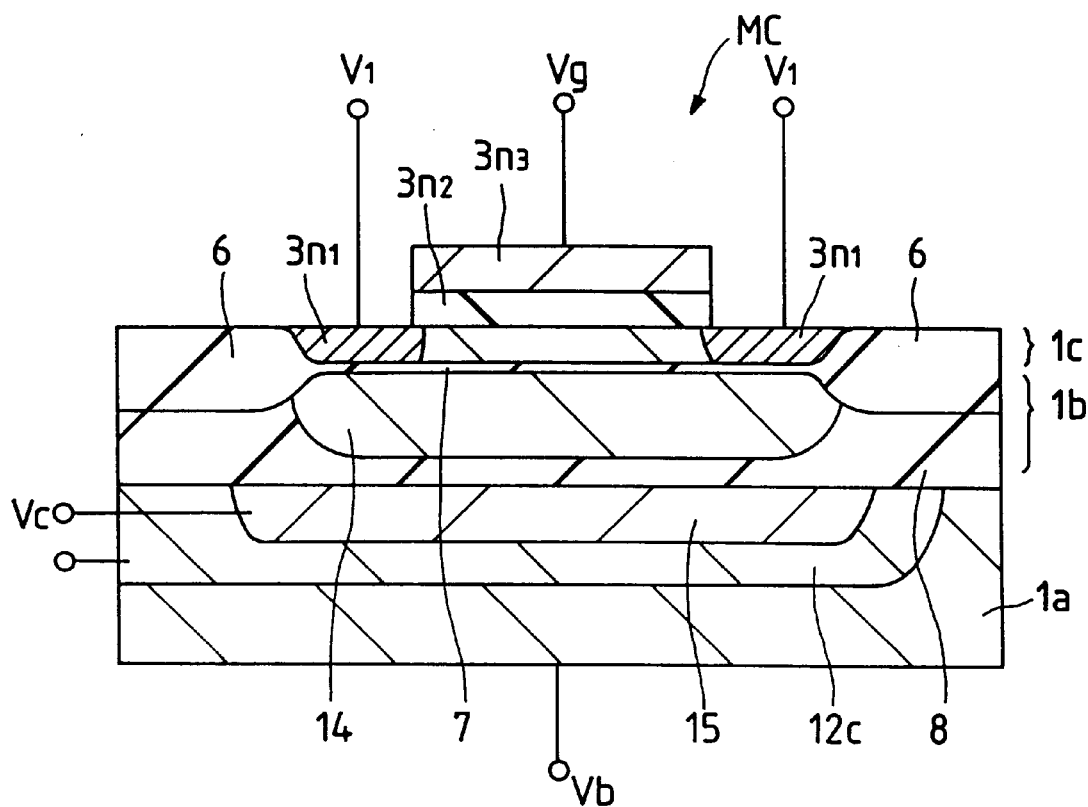
FIG. 35 is a fragmentary cross section of a further embodiment of the semiconductor integrated circuit device according to this invention.
Figure 36:
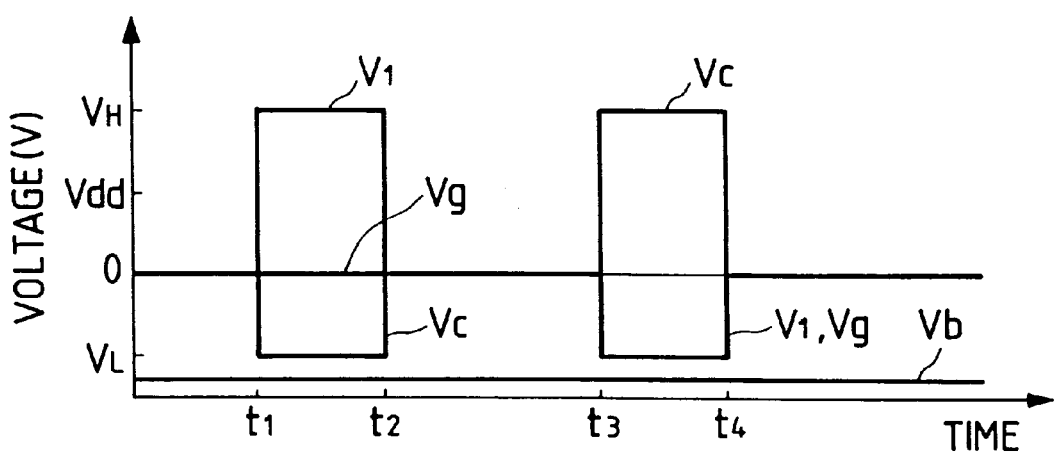
FIG. 36 is a graph showing information write and erase operations in the semiconductor integrated circuit device of FIG. 35.

FIG. 35 is a cross section showing an essential portion of the semiconductor integrated circuit device as a further embodiment of this invention. FIG. 36 shows the operation of writing and erasing information in this semiconductor integrated circuit device.

In this fifth embodiment, a control gate 15 is formed in the upper part of the semiconductor substrate $1a$. The control gate 15 is doped with an n-type impurity such as arsenic (As) at a concentration level of about $1\times10^{20}$ atoms/cm$^3$.

The control gate 15 is formed in a well $12c$ formed in the semiconductor substrate $1a$. This structure makes easy the voltage setting of the control gate 15 in each memory cell MC.

In the fifth embodiment, when the voltage $V_c$ applied to the control gate 15 is set to a high positive voltage, electrons on the semiconductor layer $1c$ side become easy to inject to the floating gate 14 side. If the voltage $V_c$ applied to the control gate 15 is set to a negative voltage, positive holes on the semiconductor layer $1c$ side are rendered readily injectable to the floating gate 14 side (or electrons rendered easily releasable).

The voltage setting at times of information writing and erasing is shown in FIG. 36. The write and erase operations are similar to those of FIG. 33 used in the fourth embodiment. In the fifth embodiment, however, because the voltage $V_c$ applied to the control gate 15 is higher than the potential of the diffusion layer $3n_1$, the substrate voltage $V_b$ can be set to a fixed potential.

The fifth embodiment can provide the following advantages in addition to those offered by the fourth embodiment.

(1) Because the substrate voltage $V_b$ can be kept constant, the operation stability of the semiconductor integrated circuit device formed on the semiconductor chip 1 can be improved.

(2) Because the control gate 15 formed of the diffusion layer is provided in the upper part of the semiconductor substrate $1a$ in each memory cell MC, it is possible to apply a specified voltage to each memory cell MC in writing and erasing information.

(3) Because the impurity concentration in the semiconductor substrate $1a$ can be reduced, it is possible to reduce the overall capacitance.

(Embodiment 6)

Figure 37:
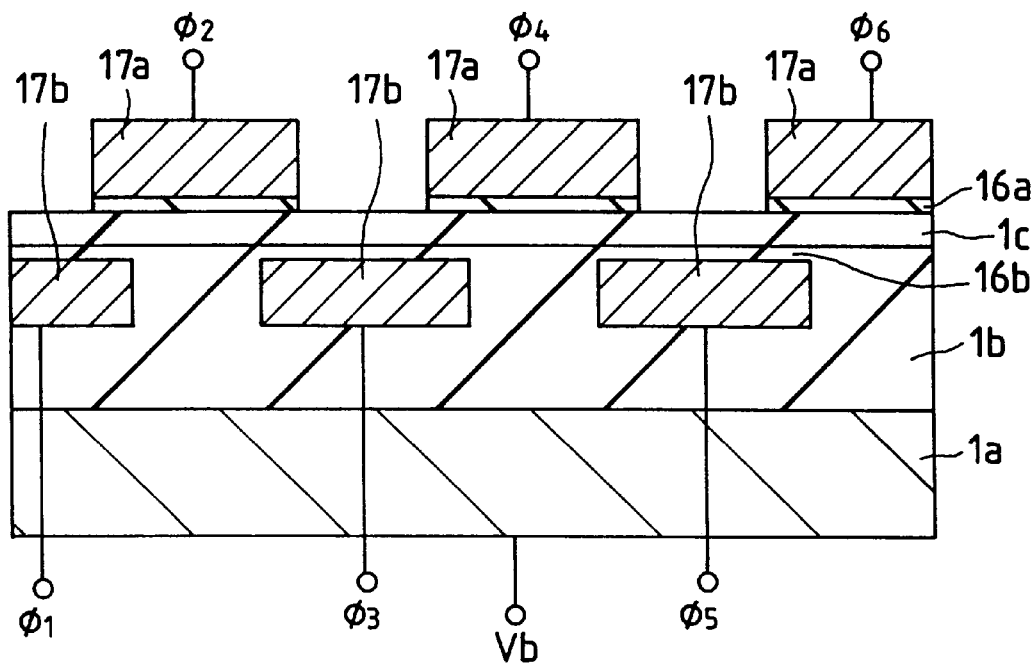
FIG. 37 is a fragmentary cross section of a further embodiment of the semiconductor integrated circuit device according to this invention.
Figure 38:
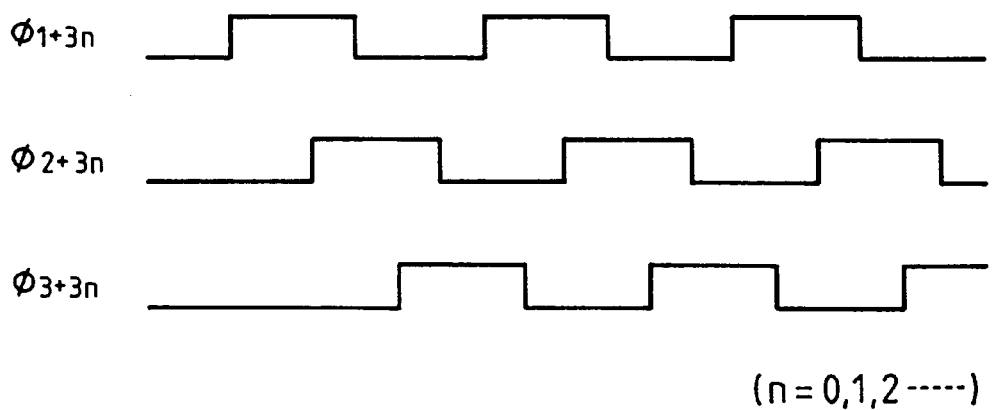
FIG. 38 is a diagram showing an example of pulse trains when the semiconductor integrated circuit device of FIG. 37 is driven.

FIG. 37 is a cross section showing an essential portion of the semiconductor integrated circuit device as a further embodiment of this invention. FIG. 38 is a diagram showing pulse trains produced when the semiconductor integrated circuit device is driven.

The semiconductor integrated circuit device of the sixth embodiment may, for example, be a charge-coupled memory having charge carrier elements, such as CCDs (charge-coupled devices). The fragmentary cross section of the CCD memory is shown in FIG. 37.

On the semiconductor layer $1c$ a plurality of CCD electrodes $17a$ are arranged close to each other with an insulating film $16a$ interposed between the semiconductor layer $1c$ and the CCD electrodes $17a$. The CCD electrode $17a$ is formed of a p-type polysilicon whose concentration level is about $1\times10^{20}$ atoms/cm$^3$.

In the sixth embodiment, also beneath the semiconductor layer $1c$ there are provided a plurality of CCD electrodes $17b$ with an insulating film $16b$ interposed. The CCD electrodes $17b$ are arranged between the adjacent CCD electrodes $17a$. The CCD electrode $17b$ is also formed of a p-type polysilicon at a concentration level of $1\times10^{20}$ atoms/cm$^3$.

This structure increases the circuit integration level. The CCD memory of this construction can not only reduce the size of steps but also reduce coupling capacitance between the adjacent CCD electrodes when compared with other type of CCD memory where adjacent CCD electrodes are partly overlapped.

In the sixth embodiment, when a specified voltage is applied to the CCD electrode $17a$ or to the CCD electrode $17b$, a potential well is generated in that part of the semiconductor layer $1c$ directly below the CCD electrode $17a$ or directly above the CCD electrode $17b$. By temporarily storing the charge in the potential well and applying a specified voltage to the succeeding CCD electrodes $17a$, $17b$ before the charge disappears, the charge can be successively fed forward to transfer information. Symbols $\phi_1\phi_6$ represent pulse signals for driving the CCD memory.

One example of pulse trains for driving the CCD memory is shown in FIG. 38. The pulse trains shown in FIG. 38 are those of a three-phase drive system ($\phi_{1+3n}$, $\phi_{2+3n}$, $\phi_{3+3n}$, n=0, 1, 2, . . .). In this case, as shown in FIG. 38, by making the pulse trains partly overlapped, it is possible to shift the charge, which contributes to information, from left to right of FIG. 37.

The sixth embodiment, therefore, provides the following advantages.

(1) Because the CCD electrodes 17b are formed in the insulating layer 1b making up the SOI substrate between the adjacent CCD electrodes 17a formed over the semiconductor layer 1c, the circuit integration is higher than that obtained when the CCD electrodes are arranged two-dimensionally.

(2) Because the intervals of the adjacent CCD electrodes 17a, 17b can be reduced, moving of the charge contributing to the information transfer can be done in good condition.

(3) Because the CCD electrodes 17b are formed in the insulating layer 1b making up the SOI substrate between the adjacent CCD electrodes 17a formed over the semiconductor layer 1c, the steps can be made smaller than those formed in other type of CCD where the adjacent CCD electrodes are partly overlapped. This facilitates the manufacture of the CCD memory and at the same time reduces the possibility of line break due to such steps. As a result, the reliability of the CCD memory can be improved.

(4) Because the CCD electrodes 17b are formed in the insulating layer 1b making up the SOI substrate between the adjacent CCD electrodes 17a formed over the semiconductor layer 1c, the coupling capacitance between the adjacent CCD electrodes 17a, 17b can be reduced. This reduces noise stemming from the coupling capacitance, improving the reliability of the CCD memory operation.

(Embodiment 7)

Figure 39:
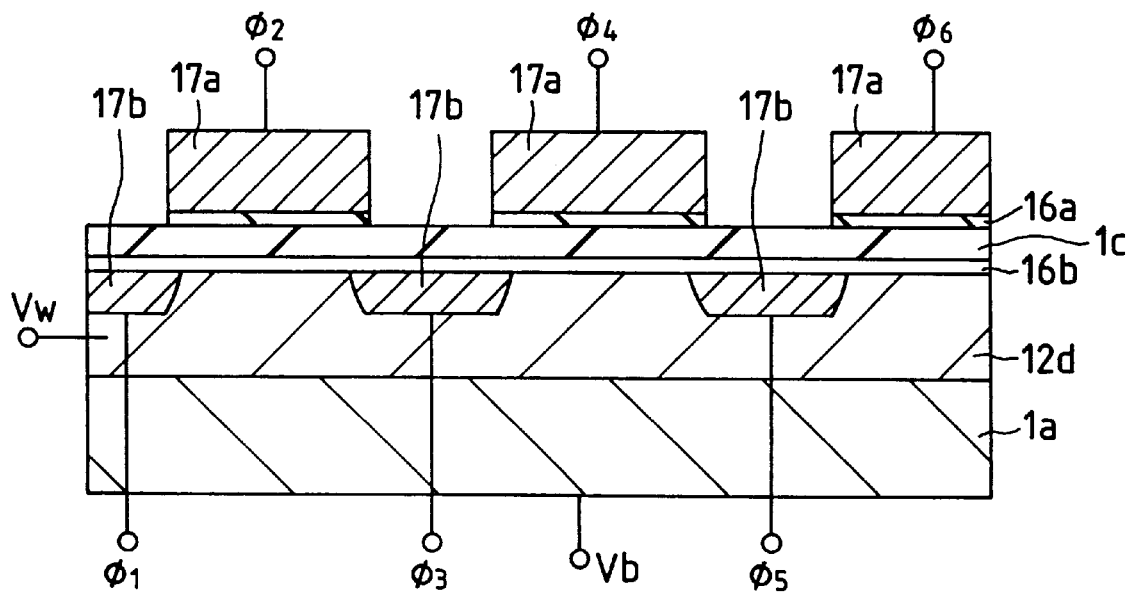
FIG. 39 is a fragmentary cross section of a further embodiment of the semiconductor integrated circuit device according to this invention.

FIG. 39 is a cross section showing an essential portion of the semiconductor integrated circuit device as a further embodiment of this invention.

In the seventh embodiment, as shown in FIG. 39, the CCD electrodes 17b are made from a diffusion layer formed in the upper part of the semiconductor substrate 1a. The CCD electrodes 17b are doped with a p-type impurity such as boron.

The CCD electrodes 17b are made by patterning the CCD electrodes 17a on the semiconductor layer 1c and, with the CCD electrodes 17a as a mask, ion-implanting an impurity into the semiconductor substrate 1a. The CCD electrodes 17b, therefore, are formed self-aligningly.

The CCD electrodes 17b are formed in a well 12d formed in the semiconductor substrate 1a. The well 12d is doped with an n-type impurity such as arsenic and can be applied a specified voltage $V_w$.

The seventh embodiment, therefore, can produce the following advantages in addition to those obtained with the sixth embodiment.

(1) By self-aligningly forming the CCD electrodes 17b beneath the semiconductor layer 1c, it is possible to form the CCD electrodes 17b more easily than in the case of the sixth embodiment.

(2) By self-aligningly forming the CCD electrodes 17b beneath the semiconductor layer 1c, it is possible to improve the arrangement and dimensional precision of the CCD electrodes 17b, which in turn improves the circuit integration level over the sixth embodiment.

(3) By self-aligningly forming the CCD electrodes 17b beneath the semiconductor layer 1c, the arrangement and dimensional precision of the CCD electrodes 17b can be improved, which in turn improves the operation characteristic of the CCD memory over the sixth embodiment.

The present invention has been described in detail in conjunction with preferred embodiments. It is noted, however, that the invention is not limited to the preceding seven embodiments (Embodiment 1 through Embodiment 7) and that various modifications can be made without departing from the spirit of the invention.

For example, although the first embodiment uses a polysilicon film for the lower electrode, it is possible to use a high melting point metal film such as tungsten or a silicide film such as tungsten silicide.

While the first and second embodiment use an n-type gate electrode and a p-type lower electrode, the gate electrode may be of a p-type and the lower electrode an n-type. In that case, the impurity introduced into the lower electrode is preferably a material having a small diffusion coefficient, such as arsenic (As) and antimony (Sb). This is intended to prevent the impurity in the lower electrode from passing through the overlying insulating film and diffusing into the semiconductor layer side when the wafers are subjected to high-temperature thermal processing during the wafer bonding in the SOI substrate manufacture process.

Figure 40:
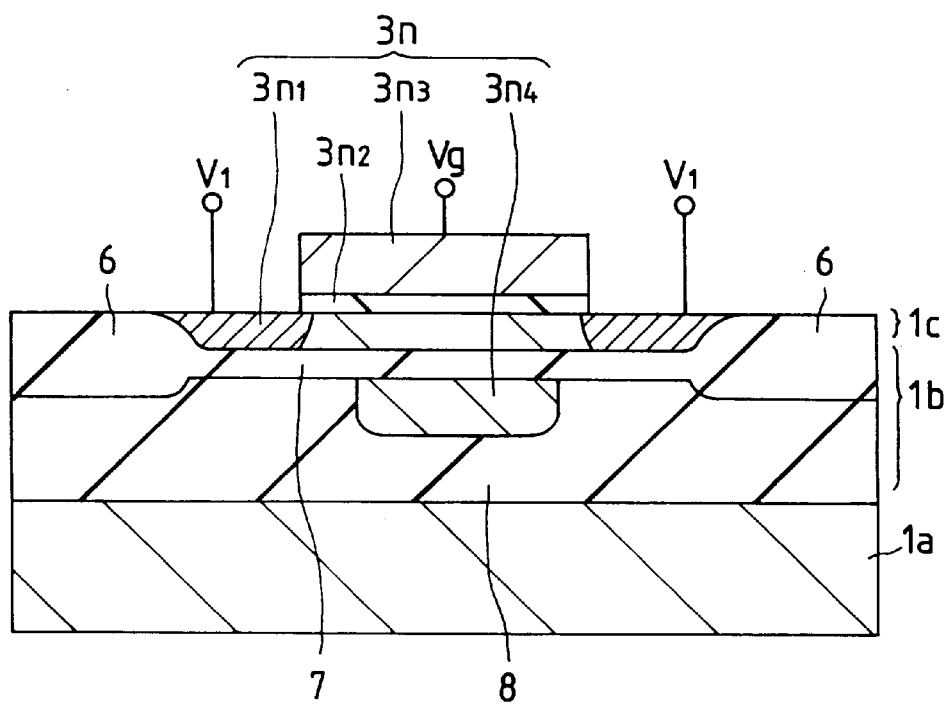
FIG. 40 is a fragmentary cross section of a further embodiment of the semiconductor integrated circuit device according to this invention.

In the first and second embodiment, the lower electrode is formed to completely underlie the MISFET. Other constructions are possible. For example, as shown in FIG. 40, the lower electrode $3n_4$ may be arranged only below the channel region of the nMIS $3n$. In this case, because the capacitance between the gate electrode $3n$, and the channel region can be made small, it is possible to increase the operation speed of the device. Further, the electric field concentration at the end of the drain region can be alleviated, improving the drain voltage resistance.

In the first and second embodiment, the gate insulating film $3n_2$, $3p_2$ and the insulating film 7 are made of $SiO_2$ (silicon oxide film). These insulating films may be formed of a laminated film consisting of a silicon nitride film (SiN) or silicon oxide film and a silicon nitride film. In this case, the calculation of $V_{th}$ needs to use the dielectric constant and thickness of the silicon oxide film converted from those of the silicon nitride film.

Figure 41:
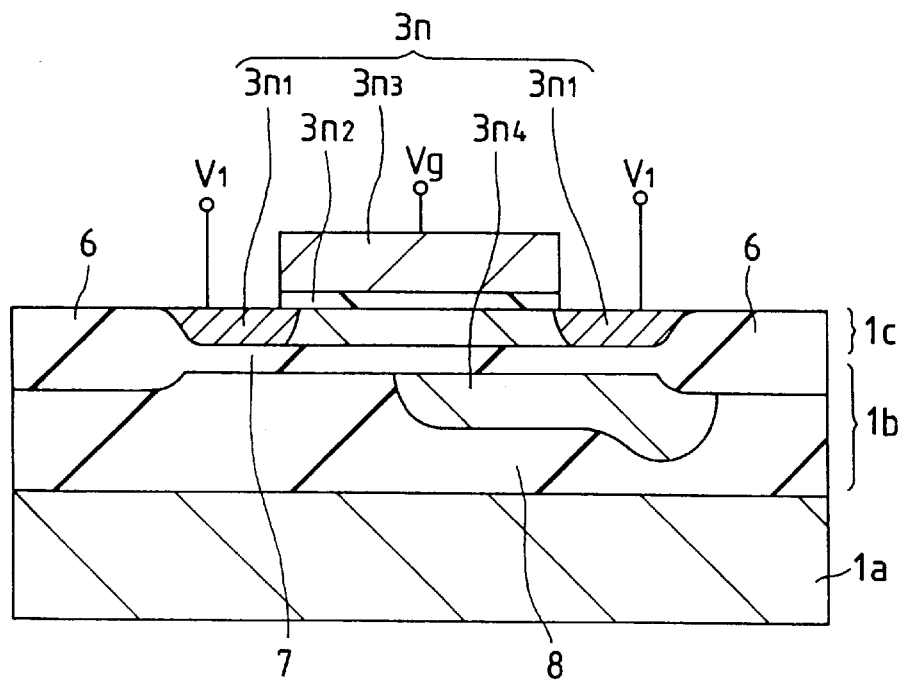
FIG. 41 is a fragmentary cross section of a further embodiment of the semiconductor integrated circuit device according to this invention.

As shown in FIG. 41, the lower electrode $3n_4$ may be provided only below the diffusion layer $3n_1$ forming the source region of the nMIS and below the channel region. In that case, in addition to the advantages of the semiconductor integrated circuit device of FIG. 40, the arrangement of FIG. 41 can suppress the reduction in the transfer conductance stemming from an increase in the source resistance. This in turn improves the device drive capability.

Figure 42:
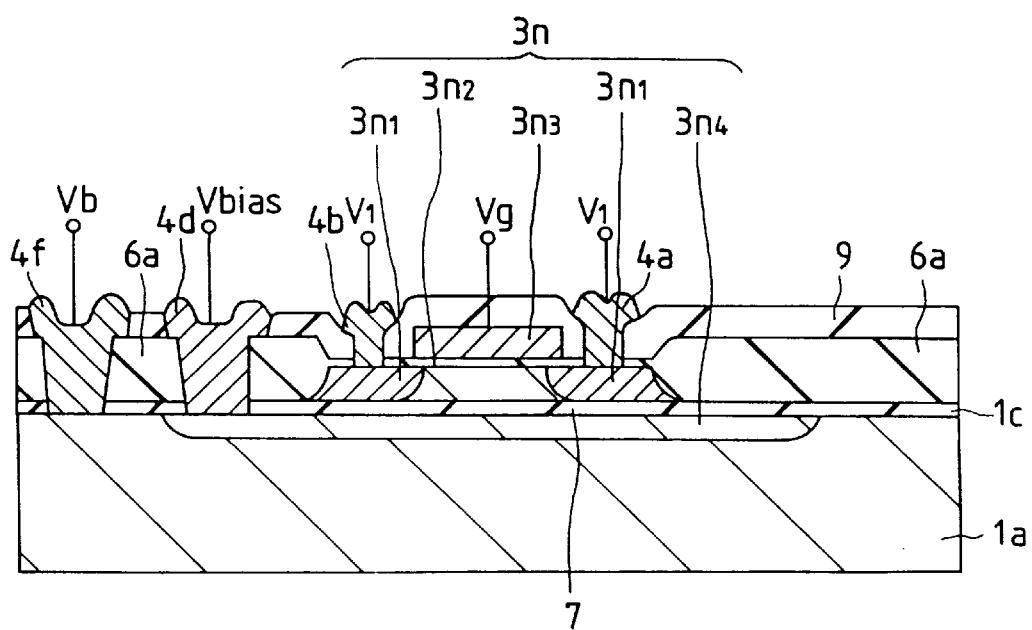
FIG. 42 is a fragmentary cross section of a further embodiment of the semiconductor integrated circuit device according to this invention.

In the second, fifth and sixth embodiment, the lower electrode, the control gate and the CCD electrode are enclosed by the well. Other structures are possible. In the case of nMIS, for example, as shown in FIG. 42, only the lower electrode may be formed in the upper part of the semiconductor substrate 1a with no surrounding well. This also applies to EEPROM and CCD memory.

The first and second embodiment apply this invention to the CMIS gate array. Other applications are also possible, which may include a Bi-CMOS gate array in which bipolar transistors and CMIS's are formed in the same semiconductor substrate, and a composite gate array in which logic circuits other than gate arrays and semiconductor memory circuits, or logic circuit and semiconductor memory circuits, are formed in the same semiconductor substrate.

Representative advantages of the present invention are briefly summarized below.

(1) Because the state of the channel being formed in the semiconductor layer can be controlled by applying a specified fixed bias voltage to the lower electrode, it is possible to improve the controllability of the threshold voltage of MISFET formed on the semiconductor layer. The semiconductor integrated circuit device, therefore, has an improved operation reliability.

(2) By using for the gate electrode a material with which the channel can be formed easily and using for the lower electrode a material with which it is difficult to form the channel, the state of the channel being formed can be controlled, making it possible to improve the controllability of the threshold voltage of the MISFET formed on the semiconductor layer. It is therefore possible to improve the operation reliability of the semiconductor integrated circuit device.

(3) By electrically connecting the gate electrode and the lower electrode, the transfer conductance can be increased by about two times compared with the case when they are not connected. The drive capability of MISFET can therefore be improved. This in turn enhances the operation reliability of the semiconductor integrated circuit device.

(4) A specified fixed bias voltage can be applied to each lower electrode of each MISFET formed on the semiconductor layer.

(5) Because the capacitance between the gate electrode and the channel region can be reduced, the operation speed of the MISFET can be improved. Further, since the electric field concentration at the end of the drain region can be alleviated, it is possible to improve the drain voltage resistance. This in turn leads to improved operation reliability and performance.

(6) By setting the gate insulating film thickness and the lower insulating film thickness to specified values, the state of the channel being formed can be controlled, making it possible to improve the controllability of the threshold voltage of the MISFET formed on the semiconductor layer. As a result, the operation reliability can be improved.

We claim:

1. A method of fabricating a semiconductor device comprising the steps of:

performing a selective oxidation in a first semiconductor substrate to form an element isolation insulating film in an element isolation region on a first main surface of said first semiconductor substrate;

forming a semiconductor film of an n-type conductivity on a first insulating film formed on said first main surface of said first semiconductor substrate;

forming a second insulating film over said first main surface of said first semiconductor substrate so as to cover said semiconductor film and said first main surface of said first semiconductor substrate;

bonding together said second insulating film and a second semiconductor substrate by thermal processing to join said first semiconductor substrate and said second semiconductor substrate;

removing a portion of a second main surface of said first semiconductor substrate, opposite to said first main surface of said first semiconductor substrate, until said element isolation insulating film is exposed while leaving a portion of said first semiconductor substrate to thereby provide a semiconductor layer;

forming a first gate insulating film of an MISFET over said semiconductor layer; and forming a first gate electrode of said MISFET over said first gate insulating film;

wherein said semiconductor film serves as a second gate electrode of said MISFET, and wherein said first insulating film serves as a second gate insulating film of said MISFET.

2. A method of fabricating a semiconductor device according to claim 1, wherein said n-type semiconductor film includes at least one of arsenic, phosphorus and antimony as an impurity.

3. A method of fabricating a semiconductor device according to claim 1, further comprising the step of:

forming a source and a drain region of said MISFET in said semiconductor layer, wherein said first semiconductor substrate has p-type conductivity, and wherein said semiconductor layer has p-type conductivity and has a boundary defined by said element isolation insulating film.

4. A method of fabricating a semiconductor device according to claim 3, wherein said first gate electrode of said MISFET is comprised of a semiconductor film of p-type conductivity.

5. A method of fabricating a semiconductor device according to claim 3, wherein said source and drain region have n-type conductivity and each has an impurity concentration higher than that of said semiconductor layer.

6. A method of fabricating a semiconductor device comprising the steps of:

preparing a first semiconductor substrate with a first insulating film formed over a first main surface of said first semiconductor substrate, a semiconductor film of n-type conductivity formed over said first insulating film, and a second insulating film formed over said semiconductor film so as to cover said first main surface;

preparing a second semiconductor substrate;

bonding together said second insulating film and said second semiconductor substrate by thermal processing to join said first semiconductor substrate and said second semiconductor substrate;

removing a portion of a second main surface of said first semiconductor substrate, opposite to said first main surface of said first semiconductor substrate, such that a portion of the first semiconductor substrate is left to provide a semiconductor layer;

forming a first gate insulating film of a MISFET over said semiconductor layer;

forming a first gate electrode of said MISFET over said first gate insulating film; and forming a source and a drain region of said MISFET in said semiconductor layer, wherein said first insulating film serves as a second gate insulating film of said MISFET, and wherein said semiconductor film serves as a second gate electrode of said MISFET.

7. A method of fabricating a semiconductor device according to claim 6, wherein said first gate electrode of said MISFET is comprised of a semiconductor film of p-type conductivity.

8. A method of fabricating a semiconductor device according to claim 6, wherein said semiconductor film of n-type conductivity includes at least one of arsenic, phosphorus and antimony as an impurity.

9. A method of fabricating a semiconductor device comprising the steps of:

preparing a first semiconductor substrate with a field insulating film formed in said first semiconductor substrate, a first insulating film formed over a first main surface of said first semiconductor substrate, a semiconductor film of n-type conductivity formed over said first insulating film, and a second insulating film formed over said semiconductor film so as to cover said first main surface;

preparing a second semiconductor substrate;

bonding together said second insulating film and said second semiconductor substrate by thermal processing to join said first semiconductor substrate and said second semiconductor substrate;

removing a portion of a second main surface of said first semiconductor substrate, opposite to said first main surface of said first semiconductor substrate, until said field insulating film is exposed while leaving a portion of said first semiconductor substrate such that a semiconductor layer is provided having a boundary defined by said field insulating film;

forming a first gate insulating film of a MISFET over said semiconductor layer;

forming a first gate electrode of said MISFET over said first gate insulating film; and forming a source and a drain region of said MISFET in said semiconductor layer;

wherein said first insulating film serves as a second gate insulating film of said MISFET, wherein said semiconductor film serves as a second gate electrode of said MISFET, and wherein said first gate electrode of said MISFET is comprised of a semiconductor film of p-type conductivity.

10. A method of fabricating a semiconductor device according to claim 9, wherein said semiconductor film of n-type conductivity includes at least one of arsenic, phosphorus and antimony as an impurity.

11. A method of fabricating a semiconductor device according to claim 9, wherein said field insulating film has a film thickness thicker than that of said first insulating film.

12. A method of fabricating a semiconductor device according to claim 6, wherein said field insulating film has a film thickness thicker than that of said first insulating film.

13. A method of fabricating a semiconductor device according to claim 3, wherein said element isolation insulating film has a film thickness thicker than that of said first insulating film.

14. A method of fabricating a semiconductor device comprising the steps of:

preparing a first semiconductor substrate with a first insulating film formed over a first main surface of said first semiconductor substrate, a semiconductor film of n-type conductivity formed over said first insulating film, and a second insulating film formed over said semiconductor film so as to cover said first main surface;

bonding together said second insulating film and a second semiconductor substrate by thermal processing to join said first semiconductor substrate and said second semiconductor substrate;

removing a portion of a second main surface of said first semiconductor substrate, opposite to said first main surface of said first semiconductor substrate such that a portion of said first semiconductor substrate is left to provide a semiconductor layer;

forming a third insulating film over said semiconductor layer so as to cover said second main surface of said first semiconductor substrate; and forming a wiring line over said third insulating film, wherein a source and a drain region of a MISFET are provided in said semiconductor layer, wherein said wiring line is electrically connected to one of said source region and said drain region of said MISFET, wherein said semiconductor film serves as a gate electrode of said MISFET, and wherein said first insulating film serves as a gate insulating film of said MISFET.

15. A method of fabricating a semiconductor device according to claim 14, wherein said first semiconductor substrate includes a capacitor element, said capacitor element being formed between said semiconductor film and said second insulating film, wherein said capacitor element includes a first electrode, a second electrode and a dielectric film formed between said first electrode and said second electrode, and wherein said capacitor element is coupled to the other of said source region and said drain region of said MISFET.

16. A method of fabricating a semiconductor device according to claim 15, wherein a memory cell of a DRAM is comprised of said MISFET and said capacitor element, and wherein said wiring line serves as a bit line of said DRAM.

17. A method of fabricating a semiconductor device comprising the steps of:

preparing a first semiconductor substrate with a first insulating film formed over a first main surface of said first semiconductor substrate, a semiconductor film of n-type conductivity formed over said first insulating film, and a second insulating film formed over said semiconductor film so as to cover said first main surface;

bonding together said second insulating film and a second semiconductor substrate by thermal processing to join said first semiconductor substrate and said second semiconductor substrate;

removing a portion of a second main surface of said first semiconductor substrate, opposite to said first main surface of said first semiconductor substrate such that a portion of said first semiconductor substrate is left to provide a semiconductor layer, wherein a source and a drain region of a MISFET are formed in said semiconductor layer, wherein said semiconductor film serves as a gate electrode of said MISFET, and wherein said first insulating film serves as a gate insulating film of said MISFET.

18. A method of fabricating a semiconductor device according to claim 17, wherein said first semiconductor substrate includes a capacitor element such that said capacitor element is formed between said semiconductor film and said second insulating film, wherein said capacitor element includes a first electrode, a second electrode, and a dielectric film formed between said first electrode and said second electrode, and wherein said capacitor element is coupled to one of said source region and said drain region of said MISFET.

19. A method of fabricating a semiconductor device according to claim 18, wherein a memory cell of a DRAM is comprised of said MISFET and said capacitor element.

20. A method of fabricating a semiconductor device according to claim 1, wherein said second gate electrode serves as a back gate electrode of said MISFET, and wherein said first insulating film serves as a back gate insulating film of said MISFET.

21. A method of fabricating a semiconductor device according to claim 1, wherein said second gate electrode serves as a floating gate electrode of a memory cell formed with said MISFET, and wherein said first gate electrode serves as a control gate electrode of said memory cell.

22. A method of fabricating a semiconductor device according to claim 14, wherein, in said first semiconductor substrate preparing step, said first semiconductor substrate includes an element isolation insulating film formed therein, and wherein, in said removing step, said portion of said second main surface of said first semiconductor substrate is removed until said element isolation insulating film is exposed.

23. A method of fabricating a semiconductor device according to claim 15, wherein, in said first semiconductor substrate preparing step, said first semiconductor substrate includes an element isolation insulating film formed therein, and wherein, in said removing step, said portion of said second main surface of said first semiconductor substrate is removed until said element isolation insulating film is exposed.

24. A method of fabricating a semiconductor device according to claim 17, wherein said gate electrode serves as a floating gate electrode of a memory cell of an electrically Erasable Programmable Read only Memory (EEPROM) formed by said MISFET.

25. A method of fabricating a semiconductor device according to claim 17, wherein, in said first semiconductor substrate preparing step, said first semiconductor substrate includes an element isolation insulating film formed therein, and wherein, in said removing step, said portion of said second main surface of said first semiconductor substrate is removed until said element isolation insulating film is exposed.

26. A method of fabricating a semiconductor device according to claim 18, wherein, in said first semiconductor substrate preparing step, said first semiconductor substrate includes an element isolation insulating film formed therein, and wherein, in said removing step, said portion of said second main surface of said first semiconductor substrate is removed until said element isolation insulating film is exposed.

27. A method of fabricating a semiconductor device according to claim 17, wherein said gate electrode serves as a floating gate electrode of a memory cell of an electrically Erasable Programmable Read Only Memory (EEPROM) formed by said MISFET.

28. A method of fabricating a semiconductor device comprising the steps of:

preparing a first semiconductor substrate with a gate insulating film formed over a first main surface of said first semiconductor substrate, a gate electrode comprised of a semiconductor film of n-type conductivity formed over said gate insulating film, an element isolation insulating film formed at said first main surface of said first semiconductor substrate and a first insulating film formed over said semiconductor film so as to cover said first main surface of said first semiconductor substrate;

bonding together said first insulating film and a second semiconductor substrate by thermal processing to join said first semiconductor substrate and said second semiconductor substrate; and removing a portion of said main surface of said first semiconductor substrate, opposite said first main surface of said first semiconductor substrate, until said element isolation insulating film is exposed, such that a portion of said first semiconductor substrate is left to provide a semiconductor layer;

wherein a source and a drain region of a MISFET are formed in said semiconductor layer.

29. A method of fabricating a semiconductor device according to claim 28, wherein said first semiconductor substrate has a capacitor element such that said capacitor element is formed between said semiconductor film and said first insulating film, wherein said capacitor element includes a first electrode, a second electrode, and a dielectric film formed between said first electrode and said second electrode, and wherein said capacitor element is coupled to one of said source and drain region of said MISFET.

30. A method of fabricating a semiconductor device according to claim 29, further comprising the steps of:

after said bonding step, forming a second insulating film over said semiconductor layer so as to cover said second main surface of said first semiconductor substrate; and forming a wiring line over said second insulating film, wherein said wiring line is electrically connected to one of said source and drain region of said MISFET.

31. A method of fabricating a semiconductor device according to claim 28, further comprising the steps of:

after said bonding step, forming a second insulating film over said semiconductor layer so as to cover said second main surface of said first semiconductor substrate; and forming a wiring line over said second insulating film, wherein said wiring line is electrically connected to one of said source and drain region of said MISFET.

32. A method of fabricating a semiconductor device according to claim 28, wherein said gate electrode serves as a floating gate electrode of a memory cell of an electrically Erasable Programmable Read Only Memory (EEPROM) formed by said MISFET.

33. A method of fabricating a semiconductor device according to claim 1, wherein said second insulating film is Boron Phosphor Silicate Glass film.

34. A method of fabricating a semiconductor device according to claim 14, wherein said second insulating film is Boron Phosphor Silicate Glass film.

35. A method of fabricating a semiconductor device according to claim 17, wherein said second insulating film is Boron Phosphor Silicate Glass film.

36. A method of fabricating a semiconductor device according to claim 28, wherein said first insulating film is Boron Phosphor Silicate Glass film.

37. A method of fabricating a semiconductor device according to claim 1, wherein said removing step is performed by polishing said second main surface of said first semiconductor substrate.

38. A method of fabricating a semiconductor device according to claim 14, wherein said removing step is performed by polishing said second main surface of said first semiconductor substrate.

39. A method of fabricating a semiconductor device according to claim 17, wherein said removing step is performed by polishing said second main surface of said first semiconductor substrate.

40. A method of fabricating a semiconductor device according to claim 28, wherein said removing step is performed by polishing said second main surface of said first semiconductor substrate.

* * * * *